(12) United States Patent
Dutta et al.

(10) Patent No.: US 9,996,650 B2
(45) Date of Patent: Jun. 12, 2018

(54) MODELING THE PERFORMANCE OF A FIELD EFFECT TRANSISTOR HAVING A DYNAMICALLY DEPLETED CHANNEL REGION

(71) Applicant: International Business Machines Corporation, Armonk, NY (US)

(72) Inventors: Anupam Dutta, Bangalore (IN); Tamilmani Ethirajan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 14/660,334

(22) Filed: Mar. 17, 2015

(65) Prior Publication Data

US 2016/0275225 A1 Sep. 22, 2016

(51) Int. Cl.
*G06F 17/50* (2006.01)

(52) U.S. Cl.
CPC ...... *G06F 17/5068* (2013.01); *G06F 17/5009* (2013.01); *G06F 17/5063* (2013.01)

(58) Field of Classification Search
CPC .................................................. G06F 17/5036
See application file for complete search history.

(56) References Cited

U.S. PATENT DOCUMENTS

| 6,871,330 | B2 | 3/2005 | Flatresse et al. |
| 7,093,214 | B2 | 8/2006 | Hogyoku |
| 7,240,308 | B2 | 7/2007 | Usui |
| 7,685,543 | B2 | 3/2010 | Tsuji et al. |
| 8,731,893 | B2 | 5/2014 | Miura-Mattausch et al. |
| 2011/0184708 | A1 | 7/2011 | Miura-Mattausch et al. |

FOREIGN PATENT DOCUMENTS

CN 101571884 A 11/2009

OTHER PUBLICATIONS

Chan et al., "Modeling the Floating-Body Effects of Fully Depleted, Partially Depleted, and Body-Grounded SOI MOSFETS ", Solid-State Electronics, vol. 48, Issue 6 , Jun. 2004, pp. 969-978.

(Continued)

*Primary Examiner* — Vuthe Siek
*Assistant Examiner* — Aric Lin
(74) *Attorney, Agent, or Firm* — Gibb & Riley, LLC; Steven J. Meyers, Esq.

(57) ABSTRACT

Disclosed are a system, a method and a computer program product for accurately modeling the performance of a body-contacted, asymmetric double gate, dynamically depleted (DD), semiconductor-on-insulator (SOI) field effect transistor (FET). This modeling can be performed, using iterative processing, to determine the conditions (e.g., back gate bias voltage, front gate bias voltage, body resistance and body charge) under which the FET channel region transitions from being in a partially depleted (PD) state such that the FET functions as a PD SOI FET to being in a fully depleted (FD) state such that the FET functions as a FD SOI FET. Once these conditions are known (i.e., once the model is generated), the DD SOI FET can be incorporated into top-level integrated circuit designs with specifications that either meet the conditions or do not meet the conditions, depending upon the desired function of the DD SOI FET within the integrated circuit.

17 Claims, 7 Drawing Sheets

(56) References Cited

OTHER PUBLICATIONS

Chen et al., "A Compact SOI Model for Fully-Depleted and Partially-Depleted 0.25 μm SIMOX Devices", Proceedings of the 1999 International Conference on Microelectronic Test Structures, vol. 12, Mar. 1999, pp. 222-226.

Mallikarjun et al., "Numerical and Charge Sheet Models for Thin-Film SOI MOSFETs", IEEE Transactions on Electron Devices, vol. 37, No. 9, Sep. 1990, pp. 2039-2051.

Lim et al., "Threshold Voltage of Thin-Film Silicon-On-Insulator (SOI) MOSFET's", IEEE Transactions Electron Devices, vol. ED-30, No. 10, Oct. 1983, pp. 1244-1250.

Veeraraghavan et al., "A Physical Short-Channel Model for Thin-Film SOI MOSFET Applicable to Device and Circuit CAD", IEEE Transactions on Electron Devices, vol. 35, No. 11, Nov. 1988, pp. 1866-1875.

Sleight et al., "A Continuous Compact MOSFET Model for SOI with Automatic Transitions Between Fully and Partially Depleted Device Behavior", IEEE, 1996, pp. 6.2.1-6.2.4.

Jang et al., "A Unified Analytical Fully Depleted and Partially Depleted SOI MOSFET Model", IEEE Transaction on Electron Devices, vol. 46, No. 9, Sep. 1999, pp. 1872-1876.

Wu et al., "Surface-Potential-Based Compact Modeling of Dynamically Depleted SOI MOSFETs", Solid Sate Electronics, vol. 54, 2010, pp. 595-604.

Pao et al., "Effects of Diffusion Current on Characteristics of Metal-Oxide (Insulator)—Semiconductor Transistors", Solid-State Electronics, Pergamon Press 1966, vol. 9, pp. 927-937.

C. C. McAndrew and J. J. Victory, "Accuracy of approximations in MOSFET charge models", IEEE Trans. Electron Devices, vol. 49, No. 1, pp. 72-81, Jan. 2002.

Langevelde et al., "An Explicit Surface-Potential-Based MOSFET Model for Circuit Simulation", Solid-Sate Electronics, vol. 44, 2000, pp. 409-418.

Rios, "An Efficient Surface Potential Solution Algorithm for Compact MOSFET Models" IEEE, 2004, pp. 31.4.1-31.4.4.

Su, "A Unified Model for Partial-Depletion and Full-Depletion SOI Circuit Designs: Using BSIMPD as a Foundation," IEEE Custom Integrated Circuits Conference, 2003, pp. 241-244.

Kumar et al., "Approaches to Nanoscale MOSFET Compact Modeling Using Surface Potential Based Models", 14th International Workshop on the Physics of Semiconductor Devices, Mumbai, India, Dec. 2007, pp. 1-6.

Chen et al., "Analytical Approximation for the MOSFET Surface Potential", Solid-State Electronics, vol. 45, 2001, pp. 335-339.

Cauchy et al., "Questions and Answers on Fully Depleted SOI Technology", SOI Industry Consortium, www.soiconsortium.org, Apr. 2010, pp. 1-17.

Wu et al., "A Nonlinear Body Resistance Model for Accurate PD/SOI Technology Characterization", IEEE, 2008, pp. 1-2.

Wu et al., "Compact Modeling of Junction Current in Dynamically Depleted SOI MOSFETs", IEEE Transactions on Electron Devices, vol. 55, No. 11, Nov. 2008, pp. 3295-3298.

MODELING THE PERFORMANCE OF A FIELD EFFECT TRANSISTOR HAVING A DYNAMICALLY DEPLETED CHANNEL REGION

BACKGROUND

The present invention relates to modeling the performance of semiconductor devices and the integrated circuits that incorporate them and, more particularly, to a system, method and computer program product that accurately models the performance of a body-contacted, asymmetric double gate, dynamically depleted (DD) semiconductor-on-insulator (SOI) field effect transistor (FET) as well as an integrated circuit that incorporates such a DD SOI FET.

Traditionally, the performance (i.e., behavioral characteristics, current-voltage (I-V) characteristics, etc.) of an integrated circuit is modeled by first generating, from the integrated circuit design layout, models for all components of the integrated circuit including for all active devices, all passive devices and all interconnects within and between those active and passive devices. The component-level models are used to generate component-level netlists and the component-level netlists are used to form a combined netlist for the integrated circuit itself. Simulations of the combined netlist are then performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. Based on the results of the simulations, a performance model for the integrated circuit is generated.

Techniques are known for modeling the performance of various different types of active devices including fully depleted (FD) SOI FETs and partially depleted (PD) SOI FETs. Recently, however, dynamically depleted (DD) SOI FETs have been developed. Such DD SOI FETs can exhibit the same characteristics as a FD SOI FET or the same characteristics as a PD SOI FET, depending upon the applied-terminal voltages (i.e., the applied voltages at the gate(s) as well as the applied voltages at the source region and drain region) and the doping profile of the channel region. Since the characteristics of these DD SOI FETs change depending upon such conditions, an accurate technique for modeling the performance of such DD SOI FETs is necessary to ensure that they will exhibit the desired characteristics when incorporated into an integrated circuit.

SUMMARY

More particularly, disclosed herein is a system that accurately models the performance of a body-contacted, asymmetric double gate, dynamically depleted (DD), semiconductor-on-insulator (SOI) field effect transistor (FET). Specifically, this DD SOI FET can comprise a semiconductor layer comprising a semiconductor layer having a back surface and a front surface opposite the back surface. The semiconductor layer can further comprise: a source region, a drain region, a contacted body region, and a channel region in the body region positioned laterally between the source region and the drain region. The DD SOI FET can further comprise a back gate adjacent to the back surface of the semiconductor layer below the channel region and a front gate adjacent to the front surface of the semiconductor layer aligned above the channel region.

The system can comprise a memory that stores a design for the DD SOI FET and at least one processor in communication with the memory. The at least one processor can access the design from the memory and, based on the design, can model the performance of the DD SOI FET. The process of modeling the performance of the DD SOI FET can include, but is not limited to, determining the conditions under which the channel region of the DD SOI FET transitions from being in a partially depleted (PD) state to being in a fully depleted (FD) state. These conditions can include, but are not limited to, different combinations of values for the front gate bias voltage, the back gate bias voltage, the body resistance and the body charge.

Specifically, the at least one processor can perform the following process steps in order to determine the conditions under which the channel region of the DD SOI FET transitions from being in a partially depleted (PD) state to being in a fully depleted (FD) state.

After all device and process parameters are input, the at least one processor can first determine source-side actual front and back surface potentials and drain-side actual front and back surface potentials for the DD SOI FET. Specifically, for the source-side of the DD SOI FET, the at least one processor can determine a partially depleted state-back surface potential of the back surface and a partially depleted state-front surface potential of the front surface, using decoupled surface potential equations, an initial body-back gate voltage, and an initial body-front gate voltage. Then, based on the partially depleted state-back surface potential and the partially depleted state-front surface potential, the at least one processor can determine a critical surface potential for a transition from the partially depleted state to the fully depleted state. Based on the critical surface potential, the at least one processor can determine an estimated fully depleted state-back surface potential of the back surface at the transition. Based on the estimated fully depleted state-back surface potential and using a coupled surface potential equation, the at least one processor can determine an actual back surface potential and an actual front surface potential for the source-side of the DD SOI FET. The at least one processor can repeat essentially the same processes to determine an actual back surface potential and an actual front surface potential for the drain-side of the DD SOI FET.

Next, the at least one processor can determine a mid-point front surface potential between the actual front surface potentials on the source-side and the drain-side and a mid-point back surface potential between the actual back surface potentials on the source-side and the drain-side. Based on multiple carrier injection sources, the at least one processor can determine a stored body charge in the body region at the mid-point front surface potential and the mid-point back surface potential. Based on the stored body charge, the at least one processor can determine a bias-dependent body resistance in the body region. Based on the bias-dependent body resistance, the at least one processor can determine an internal body node voltage in the body region. Finally, based on the internal body node voltage, the at least one processor can calculate an adjusted body-front gate voltage for the front gate and an adjusted body-back gate voltage for the back gate.

The at least one processor can further iteratively repeat the above-described processes (i.e., the determining of the source-side actual front and back surface potentials and the drain-side actual front and back surface potentials, the determining of the mid-point front surface potential and the mid-point back surface potential, the determining of the stored body charge, the determining of the bias-dependent body resistance, the determining of the internal body node voltage) and calculating until an error in the mid-point back surface potential and the mid-point front surface potential is less than a predetermined error threshold (i.e., until stabilized values for the mid-point back surface potential and the mid-point front surface potential are achieved). It should be noted that as the processes are iteratively repeated the adjusted body-back gate voltage and the adjusted body-front gate voltage acquired during the preceding calculating process can be used to determine the partially depleted state-back surface potential and the partially depleted state-front surface potential, respectively.

Once the stabilized values for the mid-point back surface potential and the mid-point front surface potential are acquired, the at least one processor can calculate terminal charges, currents, capacitances, etc., thereby completing the performance model for the DD SOI FET.

Also disclosed herein is a method for accurately modeling the performance of a body-contacted, asymmetric double gate, dynamically depleted (DD), semiconductor-on-insulator (SOI) field effect transistor (FET). Specifically, this DD SOI FET can comprise a semiconductor layer comprising a semiconductor layer having a back surface and a front surface opposite the back surface. The semiconductor layer can further comprise: a source region, a drain region, a contacted body region, and a channel region in the body region positioned laterally between the source region and the drain region. The DD SOI FET can further comprise a back gate adjacent to the back surface of the semiconductor layer below the channel region and a front gate adjacent to the front surface of the semiconductor layer aligned above the channel region.

The method can comprise storing, in memory, the design for the DD SOI FET. The method can further comprise accessing the design from the memory and, based on the design, modeling the performance of DD SOI FET. The process of modeling the performance of the DD SOI FET can include, but is not limited to, determining the conditions under which the channel region of the DD SOI FET transitions from being in a partially depleted (PD) state to being in a fully depleted (FD) state. These conditions can include, but are not limited to, different combinations of values for the front gate bias voltage, the back gate bias voltage, the body resistance and the body charge.

Specifically in this method the following process steps can be performed in order to determine the conditions under which the channel region of the DD SOI FET transitions from being in a partially depleted (PD) state to being in a fully depleted (FD) state.

After all device and process parameters are input, source-side actual front and back surface potentials and drain-side actual front and back surface potentials can be determined for the DD SOI FET. Specifically, for the source-side of the DD SOI FET, a partially depleted state-back surface potential of the back surface and a partially depleted state-front surface potential of the front surface can be determined using decoupled surface potential equations, an initial body-back gate voltage, and an initial body-front gate voltage. Then, based on the partially depleted state-back surface potential and the partially depleted state-front surface potential, a critical surface potential for a transition from the partially depleted state to the fully depleted state can be determined. Based on the critical surface potential, an estimated fully depleted state-back surface potential of the back surface at the transition can be determined. Then, a coupled surface potential equation and the estimated fully depleted state-back surface potential can be used to determine an actual back surface potential and an actual front surface potential for the source-side of the DD SOI FET. Essentially these same processes can be repeated in order to determine an actual back surface potential and an actual front surface potential for the drain-side of the DD SOI FET.

Next, the method can comprise determining a mid-point front surface potential between the actual front surface potentials on the source-side and the drain-side and a mid-point back surface potential between the actual back surface potentials on the source-side and the drain-side. Then, based on multiple carrier injection sources, a stored body charge in the body region at the mid-point front surface potential and the mid-point back surface potential can be determined and, based on the stored body charge, a bias-dependent body resistance in the body region can be determined. An internal body node voltage in the body region can then be determined based on the bias-dependent body resistance. Finally, the internal body node voltage can be used to calculate an adjusted body-front gate voltage for the front gate and an adjusted body-back gate voltage for the back gate.

The above-described processes (i.e., determining of the source-side actual front and back surface potentials and the drain-side actual front and back surface potentials, determining of the mid-point front surface potential and the mid-point back surface potential, determining of the stored body charge, determining of the bias-dependent body resistance, determining of the internal body node voltage and calculating the adjusted gate voltages) can be iteratively repeated until an error in the mid-point back surface potential and the mid-point front surface potential is less than a predetermined error threshold (i.e., until stabilized values for the mid-point back surface potential and the mid-point front surface potential are achieved). It should be noted that as the processes are iteratively repeated the adjusted body-back gate voltage and the adjusted body-front gate voltage acquired during the preceding calculating process can be used to determine the partially depleted state-back surface potential and the partially depleted state-front surface potential, respectively.

Once the stabilized values for the mid-point back surface potential and the mid-point front surface potential are acquired, terminal charges, currents, capacitances, etc. can be calculated, thereby completing the performance model for the DD SOI FET.

Also disclosed herein is a computer program product. This computer program product can comprise a computer readable storage medium having program instructions embodied therewith. The program instructions can be executable by a computer to cause the computer to perform the above-described method.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, dynamically depleted (DD) semiconductor-on-insulator (SOI) field effect transistors (FETs) have recently been developed that exhibit the same characteristics as fully depleted (FD) SOI FETs or the same characteristics as partially depleted (PD) SOI FETs, depending upon the front and back gate bias voltages used.

Figure 1A:
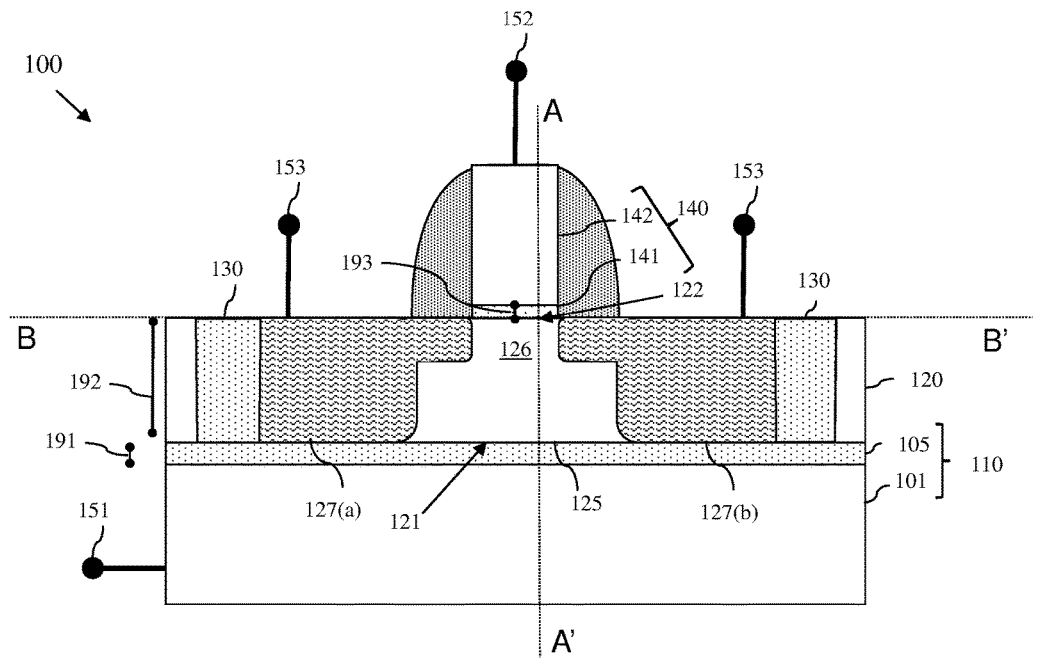
FIG. 1A is a cross-section illustration of an exemplary body-contacted, asymmetric double gate, dynamically depleted (DD) semiconductor-on-insulator (SOI) field effect transistor (FET)
Figure 1B:
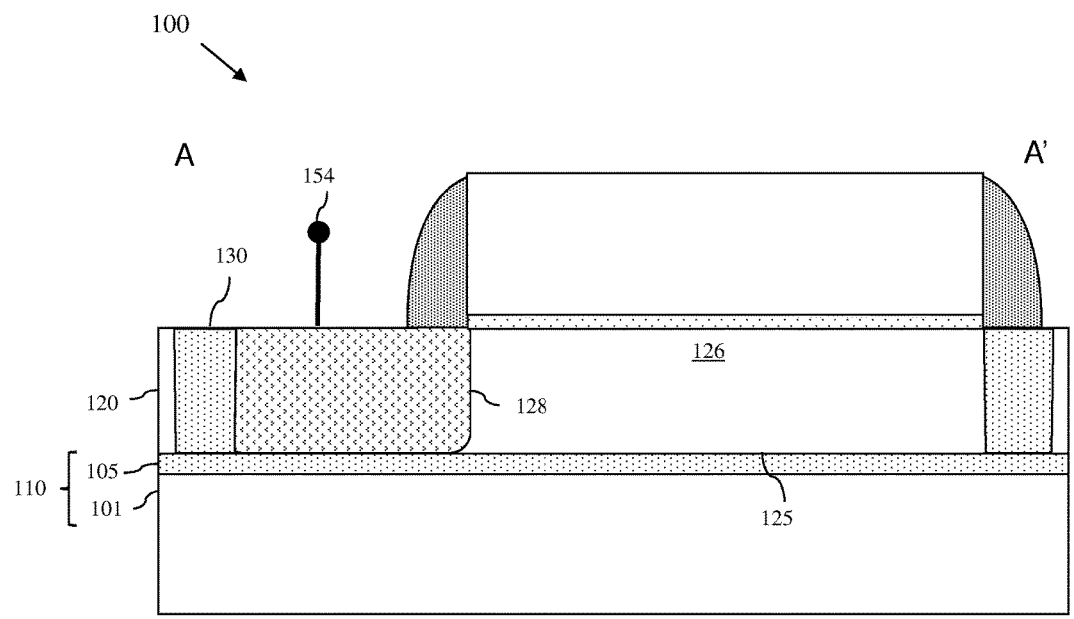
FIG. 1B is another cross-section illustration of the DD SOI FET of FIG. 1A.
Figure 1C:
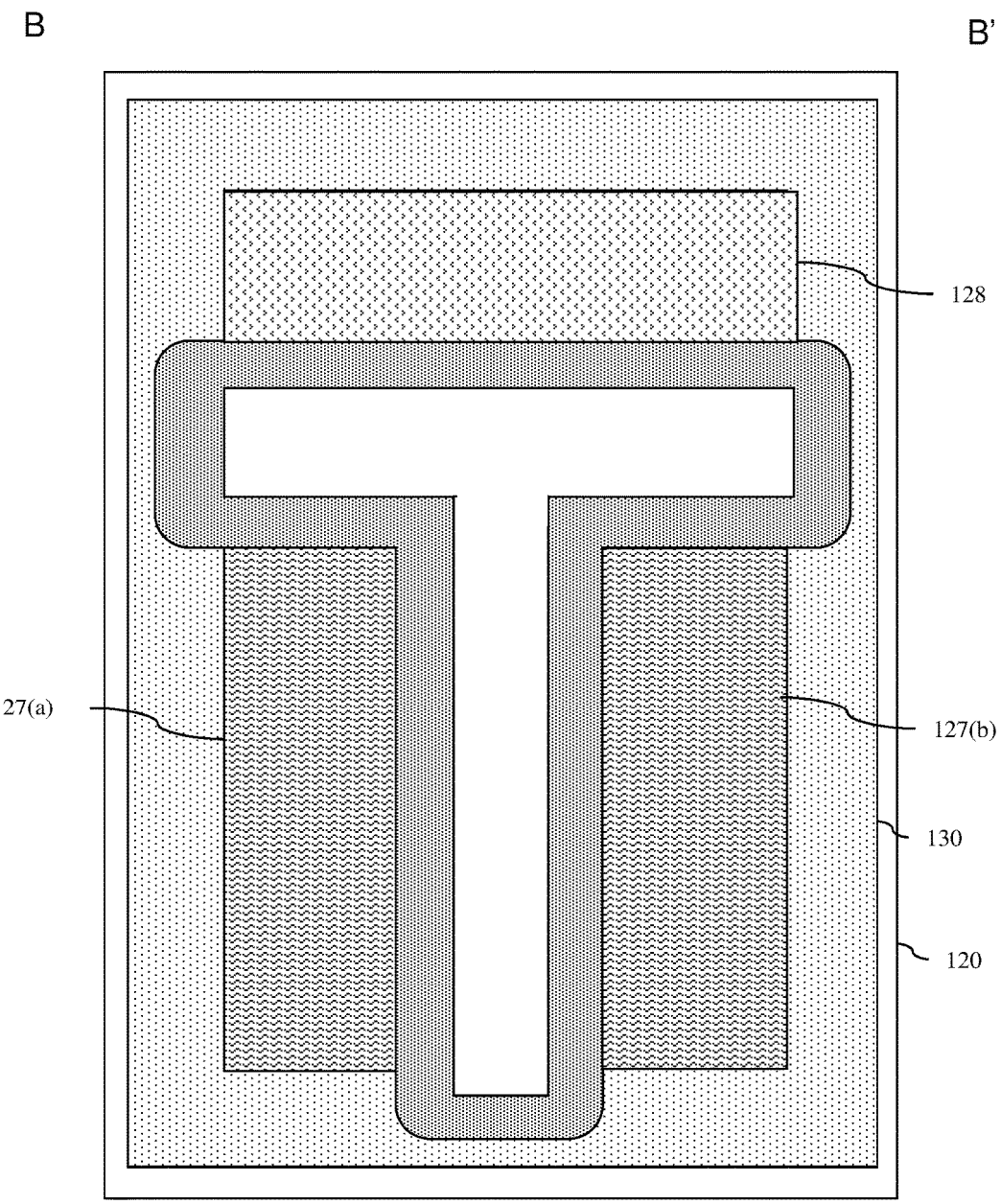
FIG. 1C is yet another cross-section illustration of the DD SOI FET of FIG. 1A.

More specifically, FIGS. 1A-1C illustrate different cross-sections of an exemplary body-contacted, asymmetric double gate, dynamically depleted (DD) semiconductor-on-insulator (SOI) field effect transistor (FET) 100. Referring to FIGS. 1A-1C in combination, the DD SOI FET 100 can comprise a semiconductor substrate 101 (e.g., a bulk silicon substrate or any other suitable semiconductor substrate), an insulator layer 105 (e.g., a silicon dioxide layer or any other suitable insulator layer) on the semiconductor substrate 101 and a semiconductor layer 120 (e.g., an epitaxial silicon layer or any other suitable epitaxial semiconductor layer) on the insulator layer 105. The semiconductor layer 120 can have a back surface 121 immediately adjacent to the insulator layer 105 and a front surface 122 opposite the back surface 121. The semiconductor layer 120 can have an active area defined by a shallow trench isolation region 130 (STI), which extends vertically through the semiconductor layer 120 to the insulator layer 105. The DD SOI FET 100 can further comprise, within the active area of the semiconductor layer 120, a source region 127(a) and a drain region 127(b) (e.g., each having a first type conductivity at a relatively high conductivity level, such as N+ conductivity in the case of an N-type FET (NFET) or P+ conductivity in the case of a P-type FET (PFET)) and a body region 125 (e.g., having a second type conductivity at a relatively low conductivity level, such as P− conductivity in the case of a NFET or N− conductivity in the case of a PFET) comprising a channel region 126 positioned laterally between the source and drain regions 127(a)-(b). Those skilled in the art will recognize that, if the body region 125 is not contacted, it will tend to float relative to ground and the threshold voltage, on current, off current and other parameters of the FET may be variable. Thus, referring particularly to FIGS. 1B and 1C, the DD SOI FET 100 can further comprise a body contact region 128 also within the active area. This body contact region 128 can be positioned laterally immediately adjacent to a side of the channel region 126 running parallel to the channel length and it can have the same type conductivity as the body region 125 (i.e., the second type conductivity) at a relatively high conductivity level (e.g., P+ conductivity in the case of an NFET or N+ conductivity in the case of a PFET). Contacts 153 and 154 can extend to the source and drain regions 127(a)-(b) and the body contact region 128, respectively.

The DD SOI FET 100 can further comprise a front gate 140 on and, particularly, immediately adjacent to the front surface 122 of the semiconductor layer 120 aligned above the channel region 126. The front gate 140 can comprise a gate dielectric layer 141 and a gate conductor layer 142 on the gate dielectric layer 141. A contact 152 can extend to the front gate 140. When the semiconductor substrate 101 is contacted (see contact 151 to the semiconductor substrate 101), the insulator layer 105 and semiconductor substrate 101 can, in combination, function as a back gate 110 immediately adjacent to the back surface 121 of the semiconductor layer 120 below the channel region 126 such that the DD SOI FET 100 can be referred to as a double gate SOI FET and, more particularly, an asymmetric double gate SOI FET because the front gate 140 and back gate 110 are different.

Those skilled in the art will recognize that, typically, the channel region of an SOI FET will be either a fully depleted (FD) channel region (e.g., if the semiconductor layer is ultra-thin, such as if the thickness of the semiconductor layer ($T_{si}$) is between 5-25 nm) such that the SOI FET is referred to as a FD SOI FET or a partially depleted (PD) channel region (e.g., if the semiconductor layer is relatively thick, such as if $T_{si}$>125 nm) such that the SOI FET is referred to as a PD SOI FET. In a FD SOI FET, the channel region will be "fully depleted" between the source and drain regions and from immediately adjacent to the gate dielectric layer of the front gate down to the insulator layer. FD SOI FETs and, particularly, body-contacted asymmetric double gate FD SOI FETs are desirable for use as radio frequency (RF) switches in the front-end modules (FEM) of mobile computerized devices (e.g., smart phones, tablets, etc.) due to low leakage current and reduced short channel effects. In a PD SOI FET, the channel region will be depleted between the source and drain regions, but only "partially depleted" in the vertical direction from immediately adjacent to the gate dielectric layer of the front gate and to some depth above the insulator layer such that the depletion region is separated from the insulator layer by a neutral region. Because of this neutral region, PD SOI FETs perform similarly to bulk semiconductor FETs and may be more susceptible to current leakage and short channel effects. The techniques used to model the performance of PD SOI FETs are more complex than the techniques used to model the performance of FD SOI FETs. In any case, techniques are known for discretely modeling the performance of FD SOI FETs and PD SOI FETs.

Recently, however, changes in the thickness of the semiconductor layer of SOI wafers have resulted in SOI FETs wherein the depletion state of the channel region can transition dynamically between the partially depleted state and the fully depleted state. Such FETs are referred to herein as dynamically depleted (DD) SOI FETs. For example, in the SOI FET 100 described above and illustrated in FIGS. 1A-1C, the semiconductor layer 120 can have a thickness that is somewhere between that typically seen in FD SOI FETs and PD SOI FETs. That is, the thickness of the semiconductor layer 120 can be greater than 25 nm (i.e., $T_{si}$>25 nm) and less than 125 nm (i.e., $T_{si}$<125 nm). For example, the thickness of the semiconductor layer 120 can be approximately 80 nm (i.e., $T_{si}$≈80 nm). Given this mid-range semiconductor layer thickness (i.e., this mid-range $T_{si}$), depending upon the applied-terminal voltages (i.e., the applied voltages at the front gate 140 and back gate 110 as well as the applied voltages at the source region 127(a) and drain region 127(b)) and the doping profile of the channel region 126, the SOI FET 100 can exhibit either the same characteristics as a FD SOI FET or the same characteristics as a PD SOI FET. Thus, the SOI FET 100 can be considered a dynamically depleted (DD) SOI FET. Since the characteristics of this DD SOI FET 100 may change depending upon such conditions, an accurate technique for modeling its performance is necessary in order to ensure that it will exhibit the desired characteristics when incorporated into an integrated circuit. For example, since body-contacted, asymmetric double gate, FD SOI FETs are particularly desirable for use as radio frequency (RF) switches in front-end modules (FEM) of mobile computerized devices (e.g., smart phones, tablets, etc.), an accurate technique for modeling the performance of DD SOI FETs (such as the DD SOI FET 100 of FIGS. 1A-1C) is necessary to determine the conditions under which DD SOI FETs can be incorporated, as RF switches, into a FEM of a mobile computerized device and function consistently as FD SOI FETs.

In view of the foregoing, disclosed herein are a system, a method and a computer program product for accurately modeling the performance of a body-contacted, asymmetric double gate, dynamically depleted (DD), semiconductor-on-insulator (SOI) field effect transistor (FET). Specifically, such modeling can be performed, using iterative processing techniques, to determine the various conditions (e.g., back gate bias voltage, front gate bias voltage, body resistance, body charge, etc.) under which the channel region of this FET transitions from being in a partially depleted (PD) state such that the FET functions as a PD SOI FET to being in a fully depleted (FD) state such that the FET functions as a FD SOI FET. Once these conditions are known (i.e., once the model is generated), the DD SOI FET can be incorporated into top-level integrated circuit designs with specifications that either meet the conditions or don't meet the conditions, depending upon the desired function of the DD SOI FET within the integrated circuit.

Figure 2:
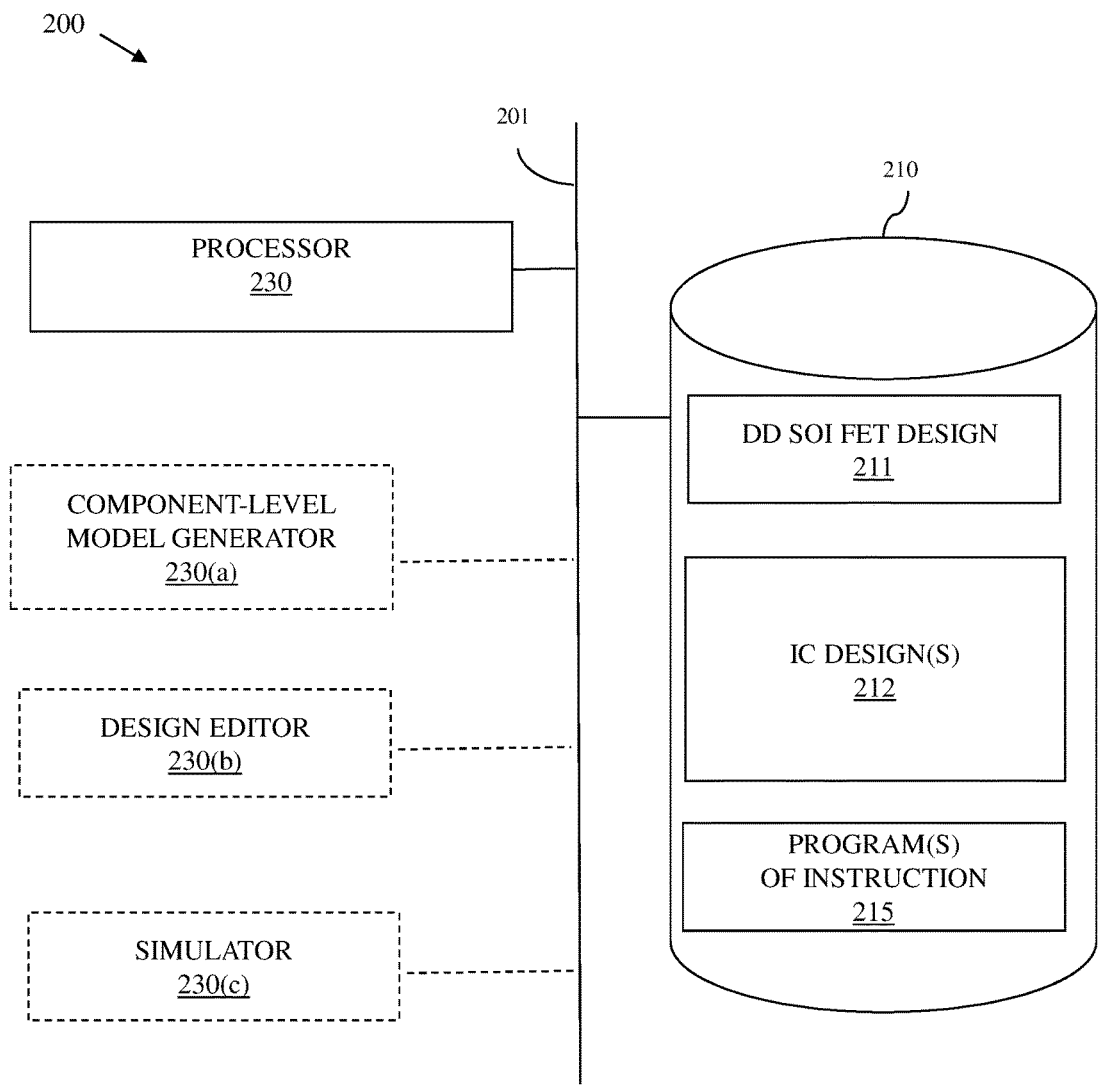
FIG. 2 is a schematic diagram illustrating a system for modeling the performance of DD SOI FET.

More particularly, FIG. 2 illustrates a system 200 that accurately models the performance of a body-contacted, asymmetric double gate, dynamically depleted (DD), semiconductor-on-insulator (SOI) field effect transistor (FET), such as the DD SOI FET 100 described above and illustrated in FIGS. 1A-1C. Referring to FIG. 2 in combination with FIGS. 1A-1C, the system 200 can comprise a computer system comprising a memory 210 (e.g., at least one computer readable storage medium, such as a computer readable storage device). The memory 210 can store a design 211 for the DD SOI FET 100, designs 212 for one or more integrated circuits into which the design 211 may be incorporated and one or more programs of instruction 215. The design 211 for DD SOI FET 100 can include various different device and process input parameters including, but not limited to, the thickness 192 of the semiconductor layer 120 ($T_{si}$), the permittivity of the semiconductor layer 120 ($\varepsilon_{si}$), the thickness 191 of the insulator layer 105 ($T_{bGox}$), the permittivity of the back gate insulator layer 105 ($T_{bGox}$), the effective channel length (L) and width (W), channel doping ($N_{sub}$), the thickness 193 of the front gate dielectric layer 141 ($T_{fGox}$), the permittivity of the front gate insulator layer ($T_{fGox}$), an initial value for effective body-back gate voltage ($V_{bGBeff}$) (also referred to herein as a back gate bias voltage), an initial value for effective body-front gate voltage ($V_{fGBeff}$) (also referred to herein as a front gate bias voltage), an initial value for external body node voltage ($V_{extB}$), etc.

The system 200 can further comprise at least one processor in communication with the memory 210 (e.g., over a system bus 201, as illustrated, or over a wired or wireless network). For example, the system 200 can comprise a single specialized processor 230 (e.g., a single specialized processing unit) that, during design of an integrated circuit, performs (i.e., is adapted to perform, is configured to perform and/or executes multiple programs of instructions 215 to perform) the various process steps, as described in detail below. Alternatively, the system 200 can comprise multiple specialized processors 230(a)-(d) (e.g., multiple different special specialized processing units), wherein, during design of an integrated circuit, each processor performs (i.e., is adapted to perform, is configured to perform and/or executes one or more specific program of instructions 215 to perform) one or more of the various process steps, as described in detail below. For purposes of illustration, three different special purpose processor(s) are shown in FIG. 2 including a component-level model generator 230(a), a design editor 230(b), and a simulator 230(c). It should be understood that FIG. 2 is not intended to be limiting and, alternatively, the various process steps can be performed by any number of one or more specialized processors.

In any case, the processor 230 (or, if applicable, the component-level model generator 230(a)) can access the design 211 of the DD SOI FET 100 from memory 210 and, based on the design 211, can model the performance of the DD SOI FET 100. The process of modeling the performance of the DD SOI FET 100 can include, but is not limited to, determining the conditions under which the channel region 126 of the DD SOI FET 100 transitions from being in a partially depleted (PD) state to being in a fully depleted (FD) state. These conditions can include, but are not limited to, different combinations of values for the front gate bias voltage, the back gate bias voltage, the body resistance and the body charge. Other conditions that can be considered include, but are not limited to, semiconductor layer surface potentials adjacent to the front and back gates, multiple carrier injection sources (e.g., impact ionization (II) and gate induced-drain leakage (GIDL)), etc.

To determine the conditions under which the channel region 126 of the DD SOI FET 100 transitions from being in a PD state to being in a FD state, the processor 230 (or, if applicable, the component-level model generator 230(a)) can first determine source-side actual front and back surface potentials and drain-side actual front and back surface potentials for the DD SOI FET 100. This can be accomplished by performing the following for the source-side of the DD SOI FET 100 and essentially repeating the process, as described in greater detail below, for the drain-side of the DD SOI FET 100.

Specifically, for the source-side of the DD SOI FET 100, the processor 230 (or, if applicable, the component-level model generator 230(a)) can determine a partially depleted state-back surface potential ($\psi_b^{PD}$) (i.e., a surface potential of the back surface 121 of the semiconductor layer 120 at the channel region 126 when the channel region 126 is in the PD state) and a partially depleted state-front surface potential ($\psi_f^{PD}$) (i.e., a surface potential of the front surface 122 of the semiconductor layer at the channel region 126 when the channel region 126 is in the PD state). These two PD state surface potentials ($\psi_b^{PD}$ and $\psi_f^{PD}$) can be determined by solving decoupled surface potential equations (i.e., independent surface potential equations for the back surface 121 and for the front surface 122, respectively), using the initial effective body-back gate voltage ($V_{bGBeff}$) and the initial effective body-front gate voltage ($V_{fGBeff}$).

The initial $V_{bGBeff}$ can be used to solve a decoupled surface potential equation to determine the $\psi_b^{PD}$ and the initial $V_{fGBeff}$ can used to solve the same decoupled surface potential equation to determine the $\psi_f^{PD}$. In each case, the decoupled surface potential equation can be derived from Poisson's equation with the boundary condition at zero and infinity (i.e., x=0 and x=∞).

Thus, for $\psi_b^{PD}$, the decoupled surface potential equation can be expressed as follows:

$$F_{PD}(\psi_b) = \frac{(V_{bGBeff} - \psi_b^{PD})^2}{\gamma_b^2} - b_1(\psi_b^{PD}), \quad (1)$$

where:

$$b_1(\psi_b^{PD}) = e^{-\psi_b^{PD}} + \psi_b^{PD} - e^{2\cdot\phi_B - V_{BS}} \cdot \left(e^{-\psi_b^{PD}} - 1 - \psi_b^{PD} - \varepsilon(\psi_b^{PD})\right), \quad (2)$$

$$\gamma_b = \sqrt{\frac{2\cdot\varepsilon_{si}\cdot q\cdot N_{sub}}{\phi_B}} \cdot \frac{1}{C_{bGox}}, \quad (3)$$

$$V_{bGBeff} = V_{bGS} - V_{BS} - V_{bGFB}, \text{ and} \quad (4)$$

$$\varepsilon(\psi_b^{PD}) = \frac{(\psi_b^{PD})^2}{2 + (\psi_b^{PD})^2}, \quad (5)$$

where γ denotes is a body factor, $\gamma_b$ is specifically the body factor as seen from the back gate, $\Phi_B$ denotes the difference between Fermi potential and intrinsic Fermi level, $V_{BS}$ denotes the body to source voltage, $\varepsilon(\psi_b^{PD})$ is an extra term incorporated for better accuracy near $V_{bGBeff}=0$, $C_{bGox}$ denotes the capacitance of the gate dielectric layer of the back gate 110 (i.e., in this case of the DD SOI FET 100, the capacitance of the insulator layer 105), $V_{bGS}$ denotes the back gate voltage with respect to the source, and $V_{bGFB}$ denotes the back gate flat band voltage.

Similarly, for $\psi_f^{PD}$, the decoupled surface potential equation can be expressed as follows:

$$F_{PD}(\psi_f^{PD}) = \frac{(V_{bGBeff} - \psi_f^{PD})^2}{\gamma_f^2} - f_1(\psi_f^{PD}), \quad (6)$$

where:

$$f_1(\psi_f^{PD}) = e^{-\psi_f^{PD}} + \psi_f^{PD} - e^{2\cdot\phi_B - V_{BS}} \cdot \left(e^{-\psi_f^{PD}} - 1 - \psi_f^{PD} - \varepsilon(\psi_f^{PD})\right), \quad (7)$$

$$\gamma_f = \sqrt{\frac{2\cdot\varepsilon_{si}\cdot q\cdot N_{sub}}{\phi_B}} \cdot \frac{1}{C_{bGox}}, \quad (8)$$

$$V_{fGBeff} = V_{fGS} - V_{BS} - V_{fGFB}, \text{ and} \quad (9)$$

$$\varepsilon(\psi_f^{PD}) = \frac{(\psi_f^{PD})^2}{2 + (\psi_f^{PD})^2}, \quad (10)$$

where $\gamma_f$ denotes the body factor as seen from the front gate, $\varepsilon(\psi_f^{PD})$ is an extra term incorporated for better accuracy near $V_{fGBeff}=0$, $C_{fGox}$ denotes the capacitance of the gate dielectric layer 141 of the front gate 140, $V_{fGS}$ denotes the front gate voltage with respect to the source, and $V_{fGFB}$ denotes the front gate flat band voltage.

Next, the processor 230 (or, if applicable, the component-level model generator 230(a)) can determine a critical surface potential ($\psi_{tr}$) for the transition of the channel region 126 from the PD state to the FD state (i.e., the threshold condition for the PD state to FD state transition), based on the PD state-back surface potential ($\psi_b^{PD}$) and the PD state-front surface potential ($\psi_f^{PD}$) and also on various charges, the channel length (L), channel doping ($N_{sub}$), the thickness ($T_{si}$) of the semiconductor layer 120, and different bias voltages at the front and back gates (i.e., $V_{bGBeff}$ and $V_{bGBeff}$), as discussed in detail below. More specifically, once $\psi_b^{PD}$ and $\psi_f^{PD}$ are determined, the critical surface potential ($\psi_{tr}$) for the transition of the channel region 126 from the PD state to the FD state can be defined as $\psi_f^{PD}$ when:

$$Q_{dep}^f + Q_{dep}^b = Q_{tsi}, \quad (11)$$

where $Q_{tsi} = q\cdot N_{sub}\cdot T_{si}$, and $\quad (12)$ where $Q_{dep}^f$ denotes the front gate depletion charge, $Q_{dep}^b$ denotes the back gate depletion charge, and $Q_{tsi}$ denotes the neutral body charge per unit area when $V_{bGBeff}$ and $V_{bGBeff}$ are both equal to zero. This $\psi_{tr}$ can further be defined by the following expressions:

$$\psi_{tr} = \psi_0 - CONS1 \cdot V_{bGBeff} + CONS2 \cdot \psi_b^{PD}; \text{ and,} \quad (13)$$

$$\psi_0 = \quad (14)$$
$$\frac{Q_{tsi}}{2\cdot\varepsilon_{si}} \cdot \left(1 - \frac{PARAM1}{L} - \frac{PARAM2}{L^2} - PARAM3 \cdot \frac{W_{jun}(V_{DB})}{L}\right) \cdot T_{si},$$

$$\text{where } CONST1 = \frac{\varepsilon_{bGox}\cdot T_{si}}{\varepsilon_{si}\cdot T_{bGox}}, \quad (15)$$

$$CONST2 = 1 + \frac{\varepsilon_{bGox}\cdot T_{si}}{\varepsilon_{si}\cdot T_{bGox}}, \quad (16)$$

where PARAM1, PARAM2 and PARAM3 are numerical values required to match the model to measured data and $W_{jun}$ denotes the drain-body junction width as a function of the drain body voltage ($V_{DB}$).

The processor 230 (or, if applicable, the component-level model generator 230(a)) can further use $\psi_{tr}$ to determine an estimated fully depleted state-back surface potential ($\psi_b^{eFD}$). That is, $\psi_{tr}$ can be used to estimate or, more particularly, to determine an initial guess for the surface potential of the back surface 121 of the semiconductor layer 120 at the channel region 126 at the point of transition from the PD state to the FD state (i.e., when the DD SOI FET 100 has just transitioned from the PD state to the FD state). More specifically, the following Sigmoid-function based transition function, which incorporates $\psi_{tr}$, can be used to determine $\psi_b^{eFD}$:

$$\psi_b^{eFD} = \frac{\psi_b^{PD}}{1 + tr} + \frac{\psi_b^{FD}}{1 + \frac{1}{tr}}, \quad (17)$$

$$\text{where } tr = e^{\frac{Rq - TRPOINT}{TRSLPOE}}, \text{ and} \quad (18)$$

$$Rq = \frac{\psi_f^{PD}}{\psi_{tr}}, \text{ and} \quad (19)$$

where $\psi_b^{PD}$ refers to the fully depleted state-back surface potential that is discussed in greater detail below and determined using equation (29), TRPOINT refers to the transition point between the partially depleted state and the fully depleted state and has a default value of 1 and TRSLOPE defines the smoothness in this transition and also has a default value of 1.

Subsequently, the processor 230 (or, if applicable, the component-level model generator 230(a)) can use the estimated fully depleted state-back surface potential ($\psi_b^{eFD}$) to determine the actual back surface potential ($\psi_b^A$) and the actual front surface potential ($\psi_f^A$). As mentioned above, $\psi_b^{FD}$ refers to the fully depleted state-back surface potential (i.e., the back surface potential when the channel region of the DD SOI FET 100 is in the fully depleted state). The actual back surface potential ($\psi_b^A$) can be any value between the partially depleted state-back surface potential ($\psi_b^{PD}$) and the fully depleted state-back surface potential ($\psi_b^{FD}$). The actual back surface potential ($\psi_b^A$) and the actual front surface potential ($\psi_f^A$) can each specifically be determined by solving the following coupled surface potential equation (i.e., which includes both $\psi_b^A$ and $\psi_f^A$ as dependent variables and which, like the decoupled surface potential equations (1) and (6) discussed above, is derived from Poisson's equation):

$$F_{FD}(\psi_b^A, \psi_f^A) = \frac{(V_{fGBeff} - \psi_f^A)^2}{\gamma_f^2} - \frac{(V_{bGBeff} - \psi_b^A)^2}{\gamma_b^2} - f_1(\psi_f^A) - f_2(\psi_b^A), \quad (20)$$

where $f_2(\psi_b^A) = e^{-\psi_b^A} + \psi_b^A - 1$, (21)

$$t_{si} = \int_{\psi_b^A}^{\psi_f^A} \frac{d\varphi}{E_\varphi}, \text{ and} \quad (22)$$

$E_\varphi$ is an electric field given by the integral of the coupled surface potential equation (20). It should be noted that the boundary conditions for this coupled surface potential equation (20) are set at zero and the thickness of the semiconductor layer ($T_{si}$).

The coupled surface potential equation (20), including equations (21)-(22) can, for example, be solved using a Newton-Raphson (NR) method, wherein iterative processing is used to approximate the value of $\psi_f^A$, considering the equation (20) and its derivative and starting with the estimated fully depleted state-back surface potential ($\psi_b^{eFD}$) as the value of $\psi_b^A$ (i.e., by substituting $\psi_b^{eFD}$ for the value of $\psi_b^A$). Iterations can be performed, for example, until the error in the surface potential solution is reduced to less than 1e-13 volts or until the number of iterations exceeds, for example, five. Iterative processing can then be repeated to approximate the value for $\psi_b^A$, again considering the equation (20) and its derivative, but this time starting with the acquired value for the actual front surface potential ($\psi_f^A$). It should be noted that a second order NR method can be used to reduce the numerical calculation overhead and to improve convergence.

Furthermore, it should be noted that in order to solve equation (20), equation (22) for the electric field must be solved numerically and can be done by invoking a charge sheet model in order to simplify equation (22) as follows:

$$E_{si}(T_{si}) = \left(\frac{\psi_f^A - \psi_b^A}{T_{si}}\right) - \frac{Q_{tsi}}{2 \cdot \varepsilon_{si}}, \quad (23)$$

where $E_{si}(T_{\overline{si}})$ is the electric field at the back surface 121 of the semiconductor layer 120 at the semiconductor layer 120-insulator layer 105 interface. In this case, a Gaussian pillbox method can be used to solve for $E_{si}(T_{\overline{si}})$. That is, from a Gaussian pill box of an infinitesimally small length at the semiconductor layer 120-insulator layer 105 interface (assuming the back surface 121 of the semiconductor layer 120 is not inverted) the following expression can be derived:

$$\varepsilon_{bGox} \cdot E_{bGox} = \varepsilon_{si} \cdot E_{si}(T_{\overline{si}}), \quad (24)$$

where $E_{bGox}$ is the electric field within the insulator layer 105 and can be expressed as follows:

$$E_{bGox} = -\frac{V_{bGBeff} - \psi_b^A}{T_{bGox}}. \quad (25)$$

Finally, with equations (23)-(25), the actual back surface potential ($\psi_b^A$) can be solved as follows:

$$\psi_b^A = CONS3 \cdot (\psi_f^A - \psi_0) + CONS4 \cdot V_{bGBeff}, \quad (26)$$

where $CONS3 = \frac{\varepsilon_{si}}{\varepsilon_{si} + \varepsilon_{bGox} \cdot \left(\frac{T_{si}}{T_{bGox}}\right)}$, (27)

$$CONS4 = \frac{\varepsilon_{bGox}}{\varepsilon_{bGox} + \varepsilon_{si} \cdot \left(\frac{T_{bGox}}{T_{si}}\right)}, \quad (28)$$

$\psi_0$ is defined by equation (14) above, and $$\psi_b^{FD} = \psi_b^A(\psi_f^A = \psi_b^{PD}). \quad (29)$$

It should be noted that equation (26) is a simple algebraic equation that captures first order dependence of the actual back surface potential ($\psi_b^A$) on the actual front surface potential ($\psi_f^A$) and on the initial effective body-back gate voltage ($V_{bGBeff}$) and that equation (26) is valid when the back surface is depleted or weakly accumulated (i.e., when $V_{bGBeff}$ is not a large negative voltage). It should further be noted that equations (20) and (26) must be solved essentially simultaneously in order to determine $\psi_f^A$ and $\psi_b^A$.

Again, these processes (i.e., as defined by equations (1)-(29)) are performed in order to determine the actual front and back surface potentials ($\psi_f^A$ and $\psi_b^A$) on the source-side of the DD SOI FET 100 (also referred to herein as the source-side actual front surface potential ($\psi_{fS}^A$) and the source-side actual back surface potential ($\psi_{bS}^A$)). These processes can further be essentially repeated in order to determine the actual front and back surface potentials ($\psi_f^A$ and $\psi_b^A$) on the drain-side of the DD SOI FET 100 (also referred to herein as the drain-side actual front surface potential ($\psi_{fD}^A$) and the drain-side actual back surface potential ($\psi_{bD}^A$)). However, when repeating these processes (i.e., as defined by equations (1)-(29)) for the drain-side of the DD SOI FET 100, it should be understood that $V_{BS}$ in equations (2) and (7) should be replaced with ($V_{BS} + V_{DS}$).

After this, the processor 230 (or, if applicable, the component-level model generator 230(a)) can determine the difference between the drain-side actual front surface potential ($\psi_{fD}^A$) and source-side actual front surface potential ($\psi_{fS}^A$) as well as the difference between the drain-side actual back surface potential ($\psi_{bD}^A$) and the source-side actual back surface potential ($\psi_{bS}^A$) using the following equations:

$$\Delta_f = \psi_{fS}^A - \psi_{fD}^A, \text{ and} \quad (30)$$

$$\Delta_b = \psi_{bS}^A - \psi_{bD}^A. \quad (31)$$

It should be noted that the processor 230 (or, if applicable, the component-level model generator 230(a)) can condition the actual front and back surface potentials on the source and drain-sides of the DD SOI FET 100 and the difference between the drain-side actual front surface potential and source-side actual front surface potential ($\Delta_f$) for multiple limiting cases of different terminal voltages. Specifically, various different techniques can be used to consider the finite precision of a CPU memory, especially, when determining the difference between two nearly equal numbers and when there is a chance that this difference will be assigned to a perfect zero if the actual value is less the precision of the CPU memory. For example, Taylor series-based approximations can be used to evaluate $\Delta_f$ for infinitesimally small $V_{DS}$ (in this case). That is, the following equations can be used to calculate the difference between the source-side surface potential and the drain-side surface potential, when the drain voltage ($V_D$) and the source voltage ($V_S$) are approximately equal (i.e., when $V_{DS}$ is extremely small):

$$\frac{(V_{fGBeff} - (\psi_{fS}^A + \Delta_f))^2}{\gamma_f^2} = F(\psi_{fS}^A + \Delta_f, V_{DS}), \quad (32)$$

where $F(\psi_{fS}^A + \Delta_f, V_{DS}) = \quad (33)$ $$\frac{(V_{bGBeff} - (\psi_{bS}^A + \Delta_b))^2}{\gamma_b^2} + f_1(\psi_{fD}^A) - f_2(\psi_{bD}^A), \text{ and}$$

$$f_2(\psi_{bD}^A) = e^{-\psi_{bD}^A} + \psi_{bD}^A - 1 \quad (34)$$

Then, using the Taylor series expansion of the right hand side (RHS) of equation (32) at $V_{DS} \approx 0$, the following equation can be approximated:

$$\frac{(V_{fGBeff} - \psi_{fS}^A)^2}{\gamma_f^2} + \Delta_f^2 + 2 \cdot \Delta_f \cdot \frac{V_{fGBeff} - \psi_{fS}^A}{\gamma_f} = \quad (35)$$

$$F(\psi_{fS}^A, 0) + \frac{\delta F}{\delta \psi_{fS}^A} \cdot \Delta_f + \frac{1}{2} \cdot \frac{\partial^2 F}{\partial^2 \psi_{fS}^A} \cdot \Delta_f^2 + \frac{\delta F}{\delta V_{DS}} \cdot V_{DS},$$

$\Delta_f$ can be found from the equation (35) which is valid for infinitesimally small $V_{DS}$. It should be understood that alternative techniques could be applied for the same purpose (i.e., CPU memory precision).

Afterwards the processor 230 (or, if applicable, the component-level model generator 230($a$)) can determine mid-point front and back surface potentials. Specifically, a mid-point front surface potential ($\psi_{fm}^A$) between the source-side front surface potential ($\psi_{fS}^A$) and the drain-side front surface potential ($\psi_{fD}^A$) and a mid-point back surface potential ($\psi_{bm}^A$) between the source-side back surface potential ($\psi_{bS}^A$) and the drain-side back surface potential ($\psi_{bD}^A$). The mid-point front surface potential ($\psi_{fm}^A$) can be the average of the source-side front surface potential ($\psi_{fS}^A$) and the drain-side front surface potential ($\psi_{fD}^A$) and the mid-point back surface potential ($\psi_{bm}^A$) can be the average of the source-side back surface potential ($\psi_{bS}^A$) and the drain-side back surface potential ($\psi_{bD}^A$).

Subsequently, the processor 230 (or, if applicable, the component-level model generator 230($a$)) can determine the total amount of body charge ($Q_B$) stored in the body region 125 of the DD SOI FET 100 at the surface potential mid-points (i.e., at the mid-point front surface potential ($\psi_{fm}^A$) and mid-point back surface potential ($\psi_{bm}^A$)) and taking into consideration multiple carrier injection sources (e.g., impact ionization (II) and gate-induced drain leakage (GIDL) current). The processor 230 (or, if applicable, the component-level model generator 230($a$)) can further determine a bias-dependent body resistance ($R_B$) of the body region 125 at the surface potential mid-points (i.e., at the mid-point front surface potential ($\psi_{fm}^A$) and the mid-point back surface potential ($\psi_{bm}^A$)) based on this stored body charge ($Q_B$). Once the bias-dependent body resistance ($R_B$) is determined, the processor 230 (or, if applicable, the component-level model generator 230($a$)) can determine an adjusted internal body node voltage ($V_B'$) at the surface potential mid-points (i.e., at the mid-point front surface potential ($\psi_{fm}^A$) and the mid-point back surface potential ($\psi_{bm}^A$)) based on that bias-dependent body resistance ($R_B$) and, based on the adjusted internal body node voltage ($V_B'$) can further calculate an adjusted effective body-front gate voltage (i.e., $V_{fGBeff}' = V_{fGBeff} - V_B'$) (also referred to herein as an adjusted body-front gate bias voltage) and an adjusted effective body-back gate voltage (i.e., $V_{bGBeff}' = V_{bGBeff} - V_B'$) (also referred to herein as an adjusted body-back gate bias voltage).

More particularly, the total amount of body charge ($Q_B$) stored in the body region 125 can be determined using the following function, which is derived using Kirchhoff's Current Law (KCL):

$$Q_B(t) = \int_0^t (I_{JUNCTION_D}(V_{DB}) + I_{IMPACT}(V_{DS}) + I_{GIDL}(V_{GD}) - I_{JUNCTION_S}(V_{BS}, \psi_{bm}^A) - I_B(V_B))dt, \quad (36)$$

where $F_{JUNCTION\_D}$ ($V_{DB}$) is the drain-side diode junction current as a function of the drain-body voltage ($V_{DB}$) (which is defined as the drain voltage ($V_D$) minus an initial value for the internal body voltage ($V_B$)), $I_{IMPACT}$ ($V_{DS}$) is the impact ionization current as a function of the drain-source voltage ($V_{DS}$) (which is defined as the drain voltage ($V_D$) minus the source voltage ($V_S$)), $I_{GIDL}$ ($V_{GD}$) is the gate-induced drain leakage current as a function of the gate-drain voltage ($V_{GD}$) (which is defined as the gate voltage ($V_G$) minus the drain voltage ($V_D$)), $I_{JUNCTION\_S}$ ($V_{BS}$, $\psi_{bm}^A$) is the source-side diode junction current as a function of the body-source voltage ($V_{BS}$) (which is defined $V_B$ minus $V_S$) and mid-point back surface potential ($\psi_{bm}^A$) (i.e., the built-in potential-lowering due to the back surface potential), and $I_B$ is the body current. For purposes of solving equation (36), the internal body voltage ($V_B$) will be set to the external body node voltage ($V_{extB}$), which is one of the initial input parameters. Thus, the total amount of stored body charge ($Q_B$) takes into account the net body charge (including holes, electrons, depletion charges) integrated over the entire device area.

Next, the following equations can be used to determine the bias-dependent body resistance ($R_B$) of the body region 125 at the mid-point front and back surface potentials (i.e., at the mid-point front surface potential ($\psi_{fm}^A$) and the mid-point back surface potential ($\psi_{bm}^A$)) based on this stored body charge ($Q_B$). Specifically, a charge ratio ($Rq_{mid}$) at the mid-point front and back surface potentials can be determined as follows:

$$Rq_{mid} = \frac{Q_{fGm}(\psi_{fm}^A) + Q_{bGm}(\psi_{bm}^A)}{Q_{tsi}(V_D)}, \quad (37)$$

where $Q_{bGm}(\psi_{bm}^A)$ is the back gate charge per unit area evaluated at $\psi_{bm}^A$, $Q_{fGm}(\psi_{fm}^A)$ is the front gate charge per unit area evaluated at $\psi_{fm}^A$, $Q_{tsi}(V_D)$ is the neutral body charge per unit area as function of the drain voltage ($V_D$), and $Rq_{mid}$ is, for example, restricted to 0.99 by the following function:

$$Rq_{mid} = \frac{(Rq_{mid} + 0.99) - \sqrt{(Rq_{mid} - 0.99)^2 + 0.01}}{2}. \quad (38)$$

Additionally, holes, which are generated due to impact ionization (II) and gate-induced drain leakage (GIDL) current, can be portioned between the source region 127(a) and the body region 125. The concentration of holes ($\rho_{hole}$=hole charge density) in the body region 125 (as opposed to $Q_B$, which is total body charge (including holes, electrons, and depletion charges) in the body region 125) can modulate the body resistance ($R_B$) and, specifically, can cause the body resistance to attain a partially depleted-like value at a high drain voltage ($V_D$), but retains the back gate-front gate coupling. Thus, two parallel resistances ($R_{BII}$ and $R_{B0}$) can be connected between internal and external body nodes and can be used to define the bias-dependent body resistance ($R_B$) as follows:

$$R_B = \frac{R_{B0} \cdot R_{BII}}{R_{B0} + R_{BII}}, \quad (39)$$

$$\text{where } R_{B0} = R_{Bneutral} \cdot \frac{1}{1 - Rq_{mid}}, \quad (40)$$

$$R_{Bneutral} = \frac{W}{q \cdot N_{sub} \cdot L \cdot T_{si}}, \text{ and} \quad (41)$$

$$R_{BII} = \frac{W}{q \cdot Q_B(f\!f\!f_{W \cdot LT_{si}}, \rho_{hole}) \cdot L \cdot T_{si}}. \quad (42)$$

Thus, $R_{BII}$ is a function of $\rho_{hole}$. In this case, the total stored body charge ($Q_B$) in the body region 125 changes $R_{BII}$, which in turn changes $R_B$.

The bias-dependent resistance of the body region ($R_B$) defined by equation (39) and the multiple carrier injection sources (e.g., impact ionization (II) and gate-induced drain leakage (GIDL) current) can subsequently be used to determine a new value for the internal body node voltage (i.e., an adjusted internal body node voltage ($V_B'$)) at the mid-point front and back surface potentials using the following equation:

$$I(B) = \frac{V_B' - V_{extB}}{R_B}. \quad (43)$$

Figure 3:
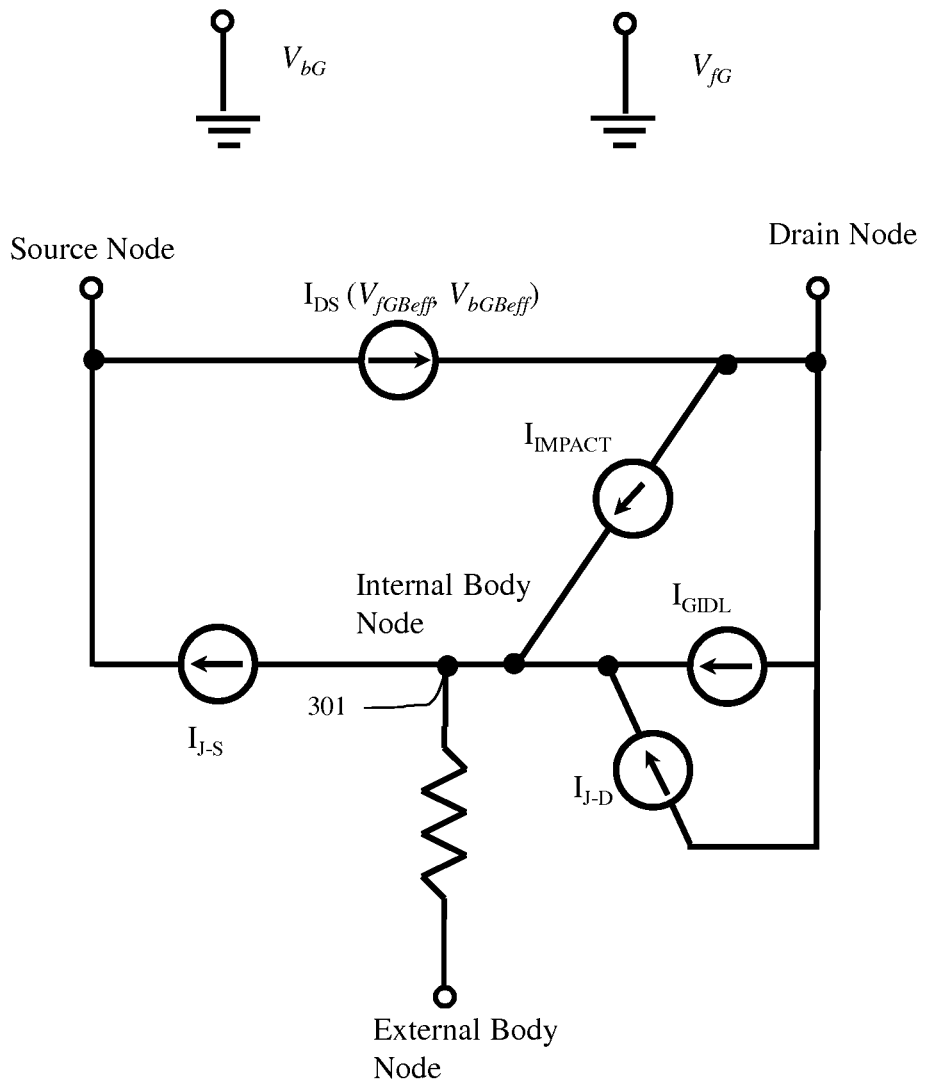
FIG. 3 is a diagram illustrating, within a DD SOI FET, modulations by the stored body at the internal body node of back and front surface potentials through the back and front gate voltages, respectively.

For purposes of illustration, FIG. 3 is a diagram showing how voltage at the internal body node 301 (i.e., the internal body node voltage ($V_B$)) can modulate the surface potentials at the back surface 121 and the front surface 122 of the semiconductor layer 120 adjacent to the back gate 110 and front gate 140 through the body-back gate voltage ($V_{bGB}=V_{bG}-V_B$) and the body-front gate voltage ($V_{fGB}=V_{fG}-V_B$), respectively. Thus, based on this new value for the internal body voltage ($V_B'$) and on the previously determined stored body charge ($Q_B$), new values for the effective body-front gate voltage and the effective body-back gate voltage (i.e., an adjusted effective body-front gate voltage ($V_{fGBeff}'$) and an adjusted effective body-back gate voltage ($V_{bGBeff}'$)) can be calculated using equation (9) and (4) above.

After the adjusted effective body-front gate voltage ($V_{fGBeff}'$) and the adjusted effective body-back gate voltage ($V_{bGBeff}'$) are calculated, the processor 230 (or, if applicable, the component-level model generator 230(a)) can iteratively repeat the processes described above to acquire stabilized values for the mid-point back surface potential and the mid-point front surface potential. For purposes of this disclosure "stabilized values" are surface potential values having an error that is less than a predetermined error threshold value. Specifically, processor 230 (or, if applicable, the component-level model generator 230(a)) can iteratively repeat the following processes: the process of determining the actual front and back surface potentials on both the source-side and the drain-side of the DD SOI FET 100 such that the source-side actual front and back surface potentials (i.e., $\psi_{fS}^A$ and $\psi_{bS}^A$) are determined using equations (1)-(29) (except that in the equations $V_{fGBeff}$ is replaced with the adjusted effective body-front gate voltage ($V_{fGBeff}'$) and $V_{bGBeff}$ is replaced with the adjusted effective body-back gate voltage ($V_{bGBeff}'$)) and such that the drain-side actual front and back surface potentials (i.e., $\psi_{fD}^A$ and $\psi_{bD}^A$)) are also determined using equations (1)-(29) (except that in the equations $V_{fGBeff}$ is replaced with the adjusted effective body-front gate voltage ($V_{fGBeff}'$), $V_{bGBeff}$ is replaced with the adjusted effective body-back gate voltage ($V_{bGBeff}'$) and $V_{BS}$ is replaced with ($V_{BS}+V_{DS}$)); the process of determining the difference between the drain-side actual front surface potential ($\psi_{fD}^A$) and source-side actual front surface potential ($\psi_{fS}^A$) as well as the difference between the drain-side actual back surface potential and the source-side actual back surface potential using equations (30)-(31); optionally, the process of conditioning the actual front and back surface potentials on the source and drain-sides of the DD SOI FET 100 and the difference between the drain-side actual front surface potential and source-side actual front surface potential ($\Delta_f$) for multiple limiting cases of different terminal voltages using equations (32)-(35); the process of determining both the mid-point front surface potential ($\psi_{fm}^A$) (i.e., the average of the source-side actual front surface potential ($\psi_{fS}^A$) and the drain-side actual front surface potential ($\psi_{fD}^A$)) and the mid-point back surface potential ($\psi_{bm}^A$) (i.e., the average of the source-side actual back surface potential ($\psi_{bS}^A$) and the drain-side actual back surface potential ($\psi_{bD}^A$)); the process of determining the amount of stored body charge ($Q_B$) using equation (36); the process of determining the body resistance ($R_B$) using equations (37)-(42); the process of determining an adjusted value for the internal body node voltage ($V_B'$) using equation (43); and the process of calculating the adjusted effective body-back gate voltage ($V_{bGBeff}'$) and the adjusted effective body-front gate voltage ($V_{fGBeff}'$) using equation (4) and (9). Thus, this technique iteratively and consistently solves for the difference between the drain-side actual front surface potential and source-side actual front surface potential ($\Delta_f$) and for the mid-point back surface potential ($\psi_{bm}^A$), and the mid-point front surface potential ($\psi_{fm}^A$) at the channel region 126 adjacent to the back gate 110 and front gate 140, respectively, as a function of the back gate bias voltage and front gate bias voltage, while taking into account the state of the channel region 126, as being fully or partially depleted, at those particular bias voltages. This technique also considers the effects of body currents and resistances which influence whether the channel region 126 is fully or partially depleted. As mentioned above, this iterative processing can be performed until stabilized values for the mid-point back surface potential ($\psi_{bm}^A$) and mid-point front surface potential ($\psi_{fm}^A$) are acquired. That is, it can be performed until the error in the mid-point back and front surface potentials ($\psi_{bm}^A$ and $\psi_{fm}^A$) is less than a predetermined error threshold (i.e., less than an error tolerance). This predetermined error threshold can, for example, be less than 1e-13 volts. It should be understood that the "error" referred to herein is defined as the difference between the solution for the given mid-point surface potential (i.e., the mid-point front surface potential or the mid-point back surface potential), as acquired from the iterative processing, and the exact solution for that given mid-point surface potential, which can never be reached due to the numerical method used.

Following such iterative processing, the processor 230 (or, if applicable, the component-level model generator 230(*a*)) can use the stabilized values (i.e., the final values) for mid-point front and back surface potentials ($\psi_{fm}^A$ and $\psi_{bm}^A$) and the difference between the drain-side actual front surface potential and source-side actual front surface potential ($\Delta_f$) to calculate terminal charges, currents, capacitances, etc. and, thereby complete the performance model of the DD SOI FET 100. For example, given the final values of $\psi_{fm}^A$, $\psi_{bm}^A$ and $\Delta_f$, the terminal charges can be defined as follows:

a front gate charge ($Q_{fG}$), where $Q_{fG}=f1(\psi_{fm}^A,\psi_{bm}^A,\Delta_f)$;  (44)

a back gate charge ($Q_{bG}$), where $Q_{bG}=f2(\psi_{fm}^A,\psi_{bm}^A)$;  (45)

a source region charge ($Q_S$), where $Q_S=f3(\psi_{fm}^A,\Delta_f)$; and  (46)

a drain region charge ($Q_D$), where $Q_D=f4(\psi_{fm}^A,\Delta_f)$,  (46)

wherein the charge neutrality condition given by the following is maintained:

$Q_B=(Q_{fG}-Q_{bG}-Q_S-Q_D)$.  (47)

The currents can also be calculated from $\psi_{fm}^A$, $\psi_{bm}^A$ and $\Delta_f$, for example, using appropriate analytical functions. The capacitances can be calculated, for example, by taking a derivative of the terminal charges with respect to transient voltage. Techniques used to calculate currents and capacitances are well known in the art. Thus, the details of these techniques have been omitted from this specification in order to allow the reader to focus on the salient aspects of the disclosed embodiments.

Once the performance of the DD SOI FET 100 is modeled such that the conditions under which the channel region 126 of the FET transitions from being in the PD state to being in the FD state are known, the at least one processor 230 (or, if applicable, the design editor 230(*b*)) can incorporate the design of the DD SOI FET 100 into one of the top-level integrated circuit designs 212 stored in memory 210. Incorporation of the design 211 of the DD SOI FET 100 into a top-level integrated circuit design should be performed considering the performance model of the DD SOI FET 100 and the operating specifications of the integrated circuit and, particularly, should be performed so as to ensure that the operating specifications of the integrated circuit either do meet the previously determined conditions (e.g., if functioning as a FD SOI FET within the integrated circuit is desired) or do not meet the previously determined conditions (e.g., if functioning as a PD SOI FET within the integrated circuit is desired). For example, since body-contacted, asymmetric double gate, FD SOI FETs are particularly desirable for use as radio frequency (RF) switches in front-end modules (FEM) of mobile computerized devices (e.g., smart phones, tablets, etc.), the DD SOI FET 100 can be incorporated, as a radio frequency switch, into the FEM of an integrated circuit wherein the operating conditions of the FEM meet the conditions under which the performance model for the DD SOI FET 100 indicates that the DD SOI FET 100 will function as an FD SOI FET. Subsequently, the processor 230 (or, if applicable, the simulator 230(*c*)) can simulate the integrated circuit. Given the technique used to model the DD SOI FET 100 and the fact that the operating conditions of the integrated circuit are considered when incorporating the DD SOI FET 100 therein, during the simulation and ultimately following manufacture, the DD SOI FET 100 should consistently function as desired (e.g., as a FD SOI FET or as a PD SOI FET).

Figure 4:
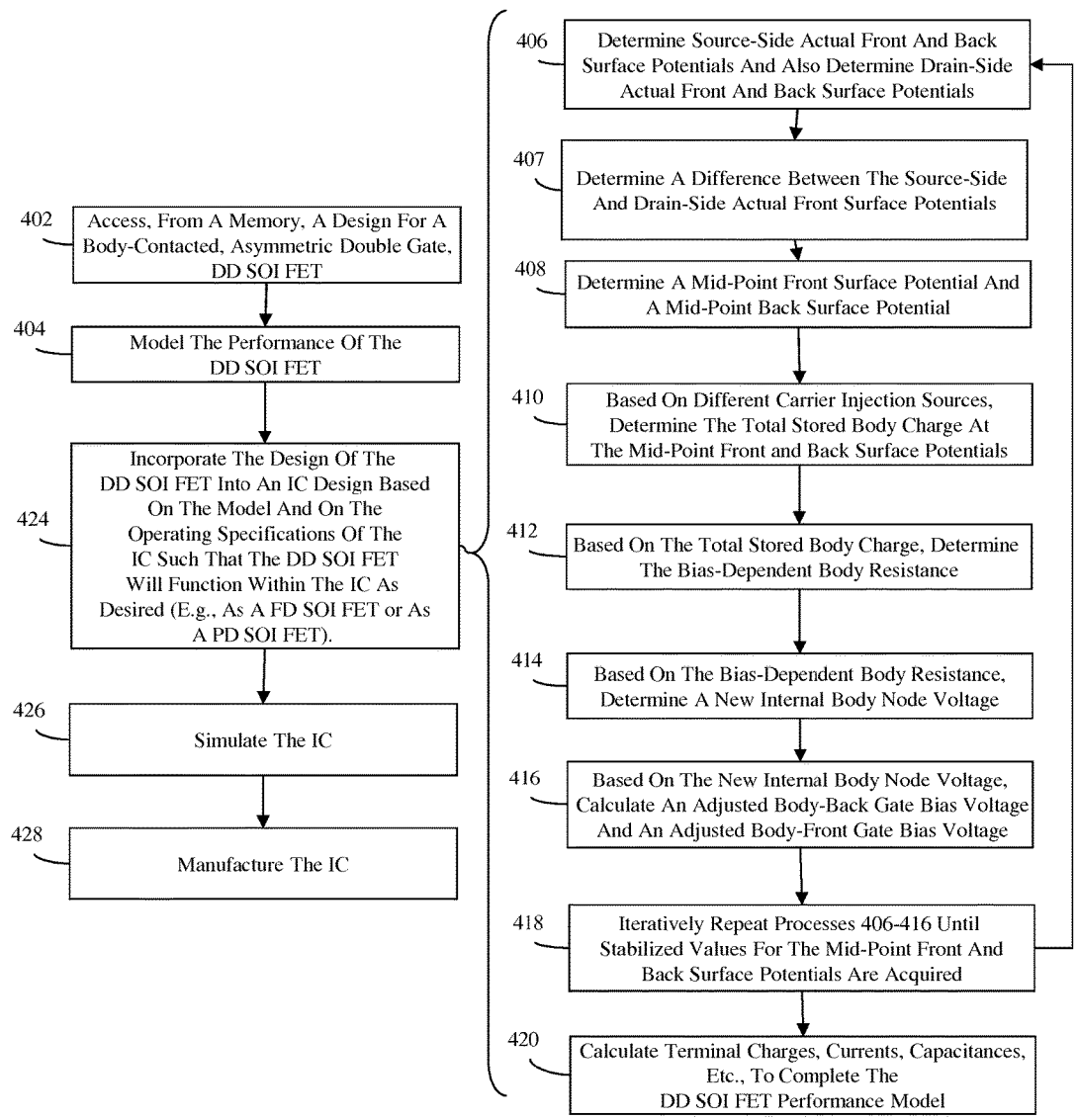
FIG. 4 is a flow diagram illustrating a method for modeling the performance of DD SOI FET.

Also disclosed herein is an associated method for accurately modeling the performance of a body-contacted, asymmetric double gate, dynamically depleted (DD), semiconductor-on-insulator (SOI) field effect transistor (FET), such as the DD SOI FET 100 described above and illustrated in FIGS. 1A-1C. Referring to the flow diagram of FIG. 4 in combination with FIGS. 1A-1C and with FIG. 2, the method can comprise accessing, from a memory 210 (e.g., at least one computer readable storage medium, such as a computer readable storage device), a design 211 for a body-contacted, asymmetric double gate, dynamically depleted (DD), semiconductor-on-insulator (SOT) field effect transistor (FET), such as the DD SOI FET 100 described above (402). The design 211 for DD SOI FET 100 can include various different device and process input parameters including, but not limited to, the thickness 192 of the semiconductor layer 120 ($T_{si}$), the permittivity of the semiconductor layer 120 ($T_{si}$), the thickness 191 of the insulator layer 105 ($T_{bGox}$), the permittivity of the back gate insulator layer 105 ($\varepsilon_{bGox}$), the effective channel length (L) and width (W), channel doping ($N_{sub}$), the thickness 193 of the front gate dielectric layer 141 ($T_{fGox}$), the permittivity of the front gate insulator layer ($\varepsilon_{fGox}$), an initial value for effective body-back gate voltage ($V_{bGBeff}$) (also referred to herein as a back gate bias voltage), an initial value for effective body-front gate voltage ($V_{fGBeff}$) (also referred to herein as a front gate bias voltage), an initial value for external body node voltage ($V_{extB}$), etc.

The method can further comprise, based on the design 211, modeling the performance of the DD SOI FET 100 (404). The process (404) of modeling the performance of the DD SOI FET 100 can include, but is not limited to, determining the conditions under which the channel region 126 of the DD SOI FET 100 transitions from being in a partially depleted (PD) state to being in a fully depleted (FD) state. These conditions can include, but are not limited to, different combinations of values for the front gate bias voltage, the back gate bias voltage, the body resistance and the body charge. Other conditions that can be considered include, but are not limited to, semiconductor layer surface potentials adjacent to the front and back gates, multiple carrier injection sources (e.g., impact ionization (II) and gate induced-drain leakage (GIDL)), etc.

Specifically, to determine the conditions under which the channel region 126 of the DD SOI FET 100 transitions from being in a PD state to being in a FD state, the following processes can be performed.

After receiving all device and process parameters, source-side actual front and back surface potentials and drain-side actual front and back surface potentials for the DD SOI FET 100 can be determined (406). This can be accomplished by performing the process steps illustrated in the flow diagram of FIG. 5 for the source-side of the DD SOI FET 100 and essentially repeating those process steps, as described in greater detail below, for the drain-side of the DD SOI FET 100.

Figure 5:
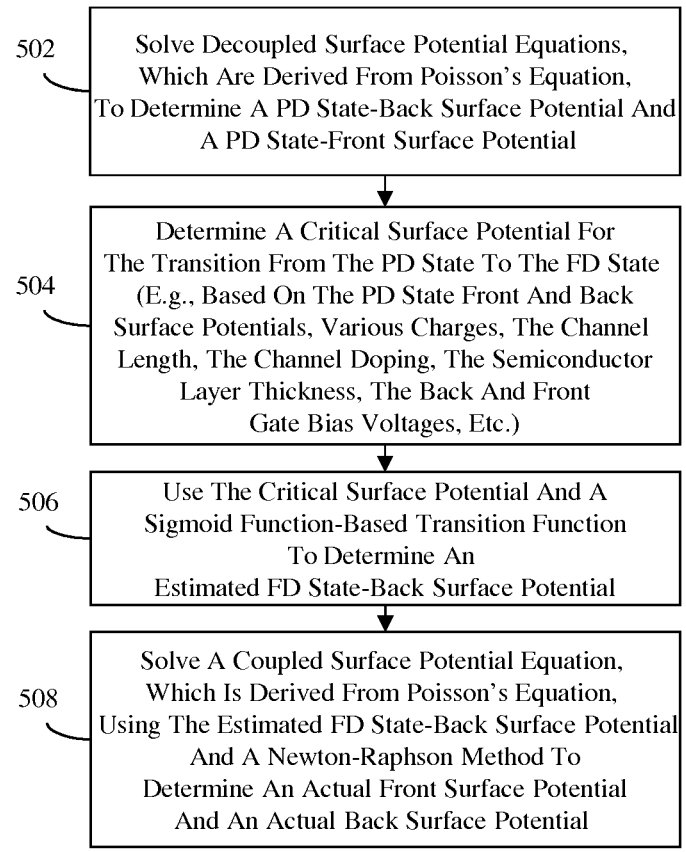
FIG. 5 is a flow diagram illustrating in greater detail processes 406 of FIG. 4; and, FIG. 6 is a schematic diagram illustrating a hardware environment for implementing the disclosed system, method and computer program product.

More particularly, referring to FIG. 5, for the source-side of the DD SOI FET 100, a partially depleted state-back surface potential ($\psi_b^{PD}$) (i.e., a surface potential of the back surface 121 of the semiconductor layer 120 at the channel region 126 when the channel region 126 is in the PD state) and a partially depleted state-front surface potential ($\psi_f^{PD}$) (i.e., a surface potential of the front surface 122 of the semiconductor layer at the channel region 126 when the channel region 126 is in the PD state) can be determined (502). These two PD state surface potentials ($\psi_b^{PD}$ and $\psi_f^{PD}$) can be determined by solving decoupled surface potential equations (i.e., independent surface potential equations for the back surface 121 and for the front surface 122, respectively), using the initial effective body-back gate voltage ($V_{bGBeff}$) and the initial effective body-front gate voltage ($V_{fGBeff}$). In each case, the decoupled surface potential equation can be derived from Poisson's equation with the boundary conditions set at zero and infinity (i.e., x=0 and x=∞) (e.g., see the decoupled surface potential equation (1) and equations (2)-(5), which as described in detail above can be used to determine $\psi_b^{PD}$; see also the decoupled surface potential equation (6) and equations (7)-(10), which as described in detail above can be used to determine $\psi_f^{PD}$).

Next, a critical surface potential ($\psi_{tr}$) for the transition of the channel region 126 from the PD state to the FD state (i.e., the threshold condition for the PD state to FD state transition) can be determined (504). Determination of this critical surface potential ($\psi_{tr}$) can be using equations (11)-(16), which are described in detail above, such that the critical surface potential ($\psi_{tr}$) is based on the PD state-back surface potential ($\psi_b^{PD}$), on the PD state-front surface potential ($\psi_f^{PD}$) and also on various charges, the channel length (L), channel doping ($N_{sub}$), the thickness (Tsi) of the semiconductor layer 120, and different bias voltages at the front and back gates (i.e., $V_{fGBeff}$ and $V_{bGBeff}$).

This critical surface potential ($\psi_{tr}$) can subsequently be used to determine an estimated fully depleted state-back surface potential ($\psi_b^{eFD}$) (506). Specifically, the Sigmoid-function based transition function of equations (17)-(19) and the critical surface potential ($\psi_{tr}$) determined at process 504 can be used to estimate or, more particularly, to determine an initial guess for the surface potential of the back surface 121 of the semiconductor layer 120 at the channel region 126 at the point of transition from the PD state to the FD state (i.e., when the DD SOI FET 100 has just transitioned from the PD state to the FD state).

Subsequently, the estimated fully depleted state-back surface potential ($\psi_b^{eFD}$) can be used to determine the actual back surface potential ($\psi_b^A$) and the actual front surface potential ($\psi_f^A$) (508). As mentioned above, $\psi_b^{FD}$ refers to the fully depleted state-back surface potential (i.e., the back surface potential when the channel region of the DD SOI FET 100 is in the fully depleted state). The actual back surface potential ($\psi_b^A$) can be any value between the partially depleted state-back surface potential ($\psi_b^{PD}$) and the fully depleted state-back surface potential ($\psi_b^{FD}$). The actual back surface potential ($\psi_b^A$) and the actual front surface potential ($\psi_f^A$) can each specifically be determined by solving the coupled surface potential equation (20), including equations (21)-(22). As discussed in detail above, these equations include both $\psi_b^A$ and $\psi_f^A$ as dependent variables, are derived from Poisson's equation with the boundary conditions set at zero and the thickness of the semiconductor layer ($T_{si}$), and can, for example, be solved using a Newton-Raphson (NR) method, wherein iterative processing is used to approximate the value of $\psi_f^A$, considering the equation (20) and its derivative and starting with the estimated fully depleted state-back surface potential ($\psi_b^{eFD}$) as the value of $\psi_b^A$ (i.e., by substituting $\psi_b^{eFD}$ for the value of $\psi_b^A$). Iterations can be performed, for example, until the error in the surface potential solution is reduced to less than 1e-13 volts or until the number of iterations exceeds, for example, five. Iterative processing can then be repeated to approximate the value for $\psi_b^A$, again considering the equation (20) and its derivative, but this time starting with the acquired value for the actual front surface potential ($\psi_f^A$). It should be noted that a second order NR method can be used to reduce the numerical calculation overhead and to improve convergence.

Furthermore, it should be noted that in order to solve equation (20), equation (22) for the electric field must be solved numerically and can be done by invoking a charge sheet model in order to simplify equation (22), as shown in equations (23)-(25) discussed above. Then, with equations (23)-(25), the actual back surface potential ($\psi_b^A$) can be solved using equations (26)-(29), discussed in detail above. Again, it should be noted that equation (26) is a simple algebraic equation that captures first order dependence of the actual back surface potential ($\psi_b^A$) on the actual front surface potential ($\psi_f^A$) and on the initial effective body-back gate voltage ($V_{bGBeff}$) and that equation (26) is valid when the back surface is depleted or weakly accumulated (i.e., when $V_{bGBeff}$ is not a large negative voltage). It should further be noted that equations (20) and (26) must be solved essentially simultaneously in order to determine $\psi_f^A$ and $\psi_b^A$.

These processes 502-508 of the flow diagram of FIG. 5 and, as defined by equations (1)-(29), can initially be performed as discussed above in order to determine the actual front and back surface potentials ($\psi_f^A$ and $\psi_b^A$) on the source-side of the DD SOI FET 100 (also referred to herein as the source-side actual front surface potential on the ($\psi_{fS}^A$) and the source-side actual back surface potential ($\psi_{bS}^A$)). These processes can further be essentially repeated in order to determine the actual front and back surface potentials ($\psi_f^A$ and $\psi_b^A$) on the drain-side of the DD SOI FET 100 (also referred to herein as the drain-side actual front surface potential ($\psi_{fD}^A$) and the drain-side actual back surface potential ($\psi_{bD}^A$)). However, when repeating these processes for the drain-side of the DD SOI FET 100, it should be understood that $V_{BS}$ in equations (2) and (7) should be replaced with ($V_{BS}+V_{DS}$).

Referring again to FIG. 4, after this, the differences between the actual front surface potentials and between the actual back surface potentials on the drain and source-sides of the DD SOI FET 100 can be determined (407). That is, the difference between the drain-side actual front surface potential ($\psi_{fD}^A$) and source-side actual front surface potential ($\psi_{fS}^A$) can be calculated using equation (30). Additionally, the difference between the drain-side actual back surface potential ($\psi_{bD}^A$) and the source-side actual back surface potential ($\psi_{bS}^A$) can be calculated using equation (31).

It should be noted that, optionally, the actual front and back surface potentials on the source and drain-sides of the DD SOI FET 100 and the differences between the actual front surface potentials and the actual back surface potentials on the drain and source-sides of the DD SOI FET 100 can be conditioned for multiple limiting cases of different terminal voltages. Specifically, various different techniques can be used to consider the finite precision of a CPU memory, especially, when determining the difference between two nearly equal numbers and when there is a chance that this difference will be assigned to a perfect zero if the actual value is less the precision of the CPU memory. For example, Taylor series-based approximations can be used to evaluate $\Delta_f$ for infinitesimally small $V_{DS}$ (in this case). See equations (32)-(35) discussed in detail above.

After the source-side actual front and back surface potentials and the drain-side actual front and back surface potentials for the DD SOI FET 100 are determined, mid-point front and back surface potentials can be determined (408). Specifically, a mid-point front surface potential ($\psi_{fm}^A$)

between the source-side front surface potential ($\psi_{fS}^A$) and the drain-side front surface potential ($\psi_{fD}^A$) and a mid-point back surface potential ($\psi_{bm}^A$) between the source-side back surface potential ($\psi_{bs}^A$) and the drain-side back surface potential ($\psi_{bD}^A$). The mid-point front surface potential ($\psi_{fm}^A$) can be the average of the source-side front surface potential ($\psi_{fS}^A$) and the drain-side front surface potential ($\psi_{fD}^A$) and the mid-point back surface potential ($\psi_{bm}^A$) can be the average of the source-side back surface potential ($\psi_{fD}^A$) and the drain-side back surface potential ($\psi_{bD}^A$).

Subsequently, equation (36), which is discussed in detail above and which is derived from Kirchhoff's Current Law (KCL), can be used to determine the total amount of body charge ($Q_B$) stored in the body region 125 of the DD SOI FET 100 at the surface potential mid-points (i.e., at the mid-point front surface potential ($\psi_{fm}^A$) and mid-point back surface potential ($\psi_{bm}^A$)), taking into consideration multiple carrier injection sources (e.g., impact ionization (II) and gate-induced drain leakage (GIDL) current) (410). For purposes of solving equation (36), the internal body voltage ($V_B$) will be set to the external body node voltage ($V_{extB}$), which is one of the initial input parameters. It should be understood that the total amount of stored body charge ($Q_B$) takes into account the net body charge (including holes, electrons, depletion charges) integrated over the entire device area.

A bias-dependent body resistance ($R_B$) of the body region 125 at the surface potential mid-points (i.e., at the mid-point front surface potential ($\psi_{fm}^A$) and the mid-point back surface potential ($\psi_{bm}^A$)) can be determined based on this total stored body charge ($Q_B$) (412). Specifically, at process 412, a charge ratio ($Rq_{mid}$) at the mid-point front and back surface potentials can determined using equations (37)-(38), discussed in detail above. Additionally, holes, which are generated due to impact ionization (II) and gate-induced drain leakage (GIDL) current, can be portioned between the source region 127(a) and the body region 125. The concentration of holes ($\rho_{hole}$=body charge density) in the body region 125 (as opposed to $Q_B$, which is total body charge in the body region 125) can modulate the body resistance ($R_B$) and, specifically, can cause the body resistance to attain a partially depleted-like value at a high drain voltage ($V_D$), but retains the back gate-front gate coupling. Thus, two parallel resistances ($R_{BH}$ and $R_{B0}$) can be connected between internal and external body nodes and can be used in equations (39)-(42) to define the bias-dependent body resistance ($R_B$). Thus, $R_{BH}$ is a function of $\rho_{hole}$ and, in this case, the total amount of stored body charge ($Q_B$) in the body region 125 changes $R_{BH}$, which in turn changes $R_B$.

Once the bias-dependent body resistance ($R_B$) is determined, an adjusted internal body node voltage ($V_B'$) at the surface potential mid-points (i.e., at the mid-point front surface potential ($\psi_{fm}^A$) and the mid-point back surface potential ($\psi_{bm}^A$)) can be determined based on that bias-dependent body resistance ($R_B$) (414). Specifically, a new value for the internal body node voltage (i.e., an adjusted internal body node voltage ($V_B'$)) at the mid-point front and back surface potentials can be determined based on the bias-dependent resistance of the body region ($R_B$), which is defined by equation (39), and on the multiple carrier injection sources (e.g., impact ionization (II) and gate-induced drain leakage (GIDL) current) using equation (43), which is discussed in detail above. For purposes of illustration, FIG. 3 is a diagram showing how voltage at the internal body node 301 can modulate the surface potentials at the back surface 121 and the front surface 122 of the semiconductor layer 120 adjacent to the back gate 110 and front gate 140 through the back gate voltage ($V_{bG}$) and the front gate voltage ($V_{fG}$), respectively. Thus, based on this new value for the internal body voltage ($V_B'$) and on the previously determined stored body charge ($Q_B$), new values for the effective body-front gate voltage and the effective body-back gate voltage (i.e., an adjusted effective body-front gate voltage ($V_{fGBeff}'$) and an adjusted effective body-back gate voltage ($V_{bGBeff}'$)) can be calculated using equations (9) and (4) above (416).

After the adjusted effective body-front gate voltage ($V_{fGBeff}'$) and the adjusted effective body-back gate voltage ($V_{bGBeff}'$) are calculated, the processes (406)-(416) described above can be iteratively repeated to acquire stabilized values (i.e., final values) for the mid-point back surface potential and the mid-point front surface potential (418). For purposes of this disclosure "stabilized values" are surface potential values having an error that is less than a predetermined error threshold value. Thus, this technique iteratively and consistently solves for the difference between the drain-side actual front surface potential and source-side actual front surface potential ($\Delta_f$) and for the mid-point back surface potential ($\psi_{bm}^A$), and the mid-point front surface potential ($\psi_{fm}^A$) at the channel region 126 adjacent to the back gate 110 and front gate 140, respectively, as a function of the back gate bias voltage and front gate bias voltage, while taking into account the state of the channel region 126, as being fully or partially depleted, at those particular bias voltages. This technique also considers the effects of body currents and resistances which influence whether the channel region 126 is fully or partially depleted. As mentioned above, this iterative processing can be performed until stabilized values for the mid-point back surface potential ($\psi_{bm}^A$) and mid-point front surface potential ($\psi_{fm}^A$) are acquired. That is, it can be performed until the error in the mid-point back and front surface potentials ($\psi_{bm}^A$ and $\psi_{fm}^A$) is less than a predetermined error threshold (i.e., less than an error tolerance). This predetermined error threshold can, for example, be less than 1e-13 volts. It should be understood that the "error" referred to herein is defined as the difference between the solution for the given mid-point surface potential (i.e., the mid-point front surface potential or the mid-point back surface potential), as acquired from the iterative processing, and the exact solution for that given mid-point surface potential, which can never be reached due to the numerical method used.

Following such iterative processing, the stabilized values (i.e., the final values) for mid-point front and back surface potentials ($\psi_{fm}^A$ and $\psi_{bm}^A$) can be used to calculate terminal charges, currents, capacitances, etc. and, thereby complete the performance model of the DD SOI FET 100 (420). For example, given the final values of $\psi_{fm}^A$, $\psi_{bm}^A$ and $\Delta_f$, terminal charges, including a front gate charge ($Q_{fG}$), a back gate charge ($Q_{bG}$), a source region charge ($Q_S$), and a drain region charge ($Q_D$), wherein the charge neutrality condition is maintained, can be determined using equations (44)-(47), discussed above. The currents can also be calculated from $\psi_{fm}^A$, $\psi_{bm}^A$, and $\Delta_f$, for example, using appropriate analytical functions and the capacitances can be calculated, for example, by taking a derivative of the terminal charges with respect to transient voltage. Techniques used to calculate currents and capacitances are well known in the art. Thus, the details of these techniques have been omitted from this specification in order to allow the reader to focus on the salient aspects of the disclosed embodiments.

Once the performance of the DD SOI FET 100 is modeled such that the conditions under which the channel region 126 of the FET transitions from being in the PD state to being in the FD state are known, the design of the DD SOI FET 100 can be incorporated into a top-level integrated circuit design 212, which is also stored in memory 210 (424). Incorporation of the design 211 of the DD SOI FET 100 into a top-level integrated circuit design 212 should be performed considering the performance model for the DD SOI FET 100 generated at process 404 and also considering the operating specifications of the integrated circuit and, particularly, should be performed so as to ensure that the operating specifications of the integrated circuit either do meet the previously determined conditions (e.g., if functioning as a FD SOI FET within the integrated circuit is desired) or do not meet the previously determined conditions (e.g., if functioning as a PD SOI FET within the integrated circuit is desired). Subsequently, the integrated circuit can be simulated (426) and manufactured (428). Given the disclosed technique used to model the performance of the DD SOI FET 100 and the fact that the operating conditions of the integrated circuit are considered when incorporating the DD SOI FET 100 into the integrated circuit design, during the simulation at process 426 and ultimately following manufacture at process 428, the DD SOI FET 100 should consistently function as desired (e.g., as a FD SOI FET or as a PD SOI FET).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Also disclosed herein is a computer program product for integrated circuit performance modeling. The computer program product can comprise a computer readable storage medium having program instructions embodied therewith (e.g., stored thereon). These program instructions can be executable by the computer to cause the computer to perform the above-described method. More particularly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
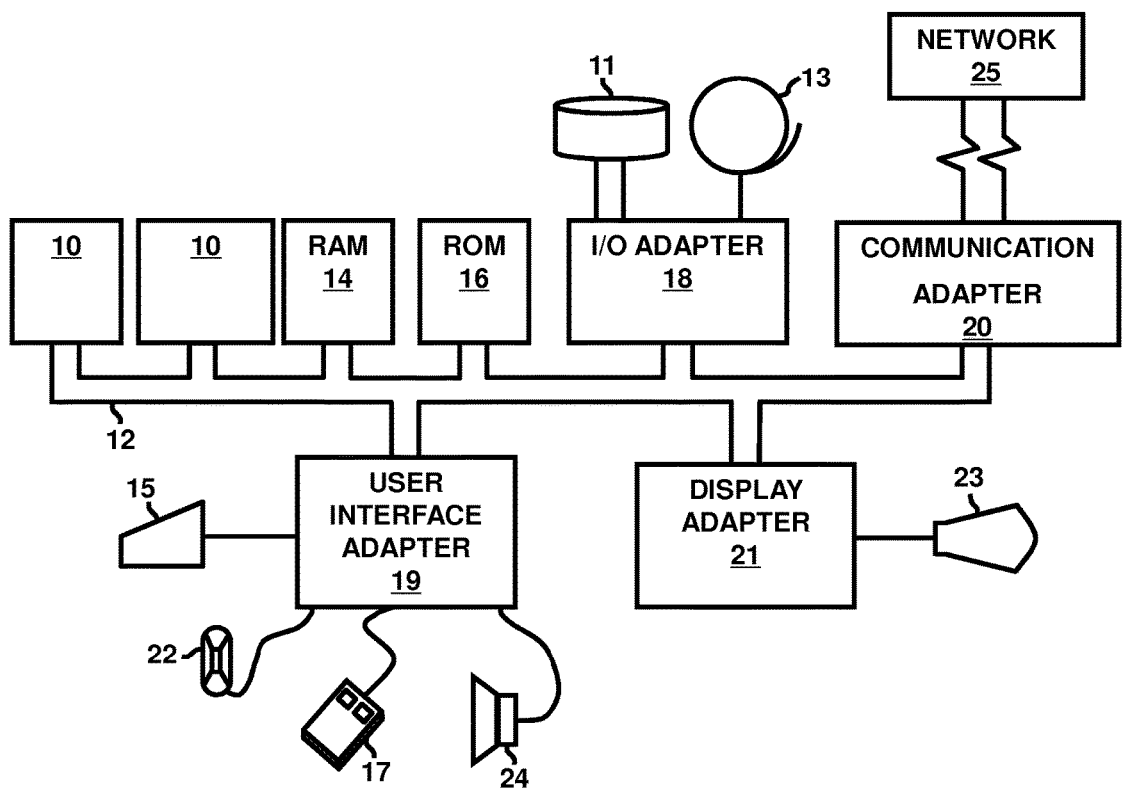

FIG. 6 depicts a representative hardware environment (i.e., a computer system) for implementing the system, method and computer program product disclosed herein. Specifically, this schematic drawing illustrates a hardware configuration of an information handling/computer system. This computer system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a memory containing a design, said design comprising physical size information and operating parameters for a dynamically depleted field effect transistor, said dynamically depleted field effect transistor comprising:
      a semiconductor layer having a back surface and a front surface opposite said back surface, said semiconductor layer comprising a source region, a drain region, a body region and a channel region within said body region and positioned laterally between said source region and said drain region;
      a back gate adjacent to said back surface at said channel region; and,
      a front gate adjacent to said front surface at said channel region and opposite said back gate; and,
   at least one processor accessing, from said memory, said design and, based on said design, modeling performance of said dynamically depleted field effect transistor, said modeling comprising determining conditions of said operating parameters under which said channel region transitions from being in a partially depleted state to being in a fully depleted state by:
      determining source-side actual front surface potential and source-side actual back surface potential and drain-side actual front surface potential and drain-side actual back surface potential comprising:
         solving decoupled surface potential equations, which are derived from Poisson's equation, to determine a partially depleted state-back surface potential and a partially depleted state-front surface potential, determining a critical surface potential for the transition from the partially depleted state to the fully depleted state, using the critical surface potential and a Sigmoid function-based transition function to determine an estimated fully depleted state-back surface potential, and solving a coupled surface potential equation, which is derived from Poisson's equation, using the estimated fully depleted state-back surface potential and a Newton-Raphson method to determine an actual front surface potential and an actual back surface potential, determining a difference between said source-side actual front surface potential and said drain-side actual front surface potential, determining a difference between said source-side actual back surface potential and said drain-side actual back surface potential, determining a mid-point front surface potential between said source-side actual front surface potential and said drain-side actual front surface potential and a mid-point back surface potential between said source-side actual back surface potential and said drain-side actual back surface potential, based on multiple carrier injection sources, determining a stored body charge in said body region at said mid-point front surface potential and said mid-point back surface potential, based on said stored body charge, determining a bias-dependent body resistance in said body region, based on said bias-dependent body resistance, determining an internal body node voltage in said body region, based on said internal body node voltage, calculating an adjusted effective body-front gate voltage for said front gate and an adjusted effective body-back gate voltage for said back gate, and iteratively repeating said determining of said source-side actual front surface potential and source-side actual back surface potential and said drain-side actual front surface potential and drain-side actual back surface potential, said determining of said mid-point front surface potential and said mid-point back surface potential, said determining of said stored body charge, said determining of said bias-dependent body resistance, said determining of said internal body node voltage and said calculating said adjusted effective body-front gate voltage for said front gate and said adjusted effective body-back gate voltage for said back gate until an error in said mid-point back surface potential and said mid-point front surface potential is less than a predetermined error threshold;

responsive to said determining said conditions of said operating parameters under which said channel region transitions from being in a partially depleted state to being in a fully depleted state said processor incorporating said design for said dynamically depleted field effect transistor into a design for an integrated circuit;

said processor storing said design for said integrated circuit in said memory; and said processor causing said design for said integrated circuit having said design for said dynamically depleted field effect transistor to be manufactured.

2. The system of claim 1, said determining of said source-side actual front surface potential and source-side actual back surface potential and said drain-side actual front surface potential and drain-side actual back surface potential comprising, for each side:

determining a partially depleted state-back surface potential of said back surface and a partially depleted state-front surface potential of said front surface, said determining of said partially depleted state-back surface potential and said partially depleted state-front surface potential being performed using decoupled surface potential equations, an initial effective body-back gate voltage, and an initial effective body-front gate voltage;

based on said partially depleted state-back surface potential and said partially depleted state-front surface potential, determining a critical surface potential for a transition from said partially depleted state to said fully depleted state;

based on said critical surface potential, determining an estimated fully depleted state-back surface potential of said back surface at said transition; and, based on said estimated fully depleted state-back surface potential, determining an actual back surface potential and an actual front surface potential, said determining of said actual back surface potential and said actual front surface potential being performed using a coupled surface potential equation, said adjusted effective body-back gate voltage and said adjusted effective body-front gate voltage being used, during said iteratively repeating, to determine said partially depleted state-back surface potential and said partially depleted state-front surface potential, respectively.

3. The system of claim 2, said decoupled surface potential equations being derived from Poisson's equation with boundary conditions set at zero and infinity and said coupled surface potential equation being derived from Poisson's equation with boundary conditions set at zero and a thickness of said semiconductor layer.

4. The system of claim 2, said critical surface potential being determined as a function of channel length, channel doping, different bias voltages at said front gate, at said back gate, at a source region, at a drain region and an external body node voltage.

5. The system of claim 3,
said determining of said estimated fully depleted state-back surface potential comprising using a Sigmoid function-based transition function, and
said coupled surface potential equation being solved using a Newton-Raphson method.

6. The system of claim 1, said bias-dependent body resistance being dependent upon a density of holes in said body region.

7. The system of claim 1, wherein modulation of said internal body node voltage modulates surface potentials of said back surface and said front surface at said channel region.

8. The system of claim 1, said multiple carrier injection sources comprising impact ionization current and gate-induced drain leakage current.

9. The system of claim 1, said at least one processor further:

simulating performance of said integrated circuit based on said modeling of said performance of said dynamically depleted field effect transistor.

10. A method comprising:

accessing, from a memory, a design, said design comprising physical size information and operating parameters for a dynamically depleted field effect transistor, said dynamically depleted field effect transistor comprising:
    a semiconductor layer having a back surface and a front surface opposite said back surface, said semiconductor layer comprising a source region, a drain region, a body region and a channel region within said body region and positioned laterally between said source region and said drain region;
    a back gate adjacent to said back surface at said channel region; and,
    a front gate adjacent to said front surface at said channel region and opposite said back gate;

based on said design, modeling performance of said dynamically depleted field effect transistor, said modeling comprising determining conditions of said operating parameters under which said channel region transitions from being in a partially depleted state to being in a fully depleted state by:
    determining source-side actual front surface potential and source-side actual back surface potential and drain-side actual front surface potential and drain-side actual back surface potential comprising:
        solving decoupled surface potential equations, which are derived from Poisson's equation, to determine a partially depleted state-back surface potential and a partially depleted state-front surface potential,
        determining a critical surface potential for the transition from the partially depleted state to the fully depleted state,
        using the critical surface potential and a Sigmoid function-based transition function to determine an estimated fully depleted state-back surface potential, and
        solving a coupled surface potential equation, which is derived from Poisson's equation, using the estimated fully depleted state-back surface potential and a Newton-Raphson method to determine an actual front surface potential and an actual back surface potential,
    determining a difference between said source-side actual front surface potential and said drain-side actual front surface potential,
    determining a difference between said source-side actual back surface potential and said drain-side actual back surface potential,
    determining a mid-point front surface potential between said source-side actual front surface potential and said drain-side actual front surface potential and a mid-point back surface potential between said source-side actual back surface potential and said drain-side actual back surface potential,
    based on multiple carrier injection sources, determining a stored body charge in said body region at said mid-point front surface potential and said mid-point back surface potential,
    based on said stored body charge, determining a bias-dependent body resistance in said body region,
    based on said bias-dependent body resistance, determining an internal body node voltage in said body region,
    based on said internal body node voltage, calculating an adjusted effective body-front gate voltage for said front gate and an adjusted effective body-back gate voltage for said back gate, and
    iteratively repeating said determining of said source-side actual front surface potential and source-side actual back surface potential and said drain-side actual front surface potential and drain-side actual back surface potential, said determining of said mid-point front surface potential and said mid-point back surface potential, said determining of said stored body charge, said determining of said bias-dependent body resistance, said determining of said internal body node voltage and said calculating said adjusted effective body-front gate voltage for said front gate and said adjusted effective body-back gate voltage for said back gate until an error in said mid-point back surface potential and said mid-point front surface potential is less than a predetermined error threshold;

responsive to said determining said conditions of said operating parameters under which said channel region transitions from being in a partially depleted state to being in a fully depleted state, incorporating said design for said dynamically depleted field effect transistor into a design for an integrated circuit, and storing said design for said integrated circuit in said memory; and manufacturing said integrated circuit having said design for said dynamically depleted field effect transistor.

11. The method of claim 10, said determining of said source-side actual front surface potential and source-side actual back surface potential and said drain-side actual front surface potential and drain-side actual back surface potential comprising, for each side:
    determining a partially depleted state-back surface potential of said back surface and a partially depleted state-front surface potential of said front surface, said determining of said partially depleted state-back surface potential and said partially depleted state-front surface potential being performed using decoupled surface potential equations, an initial effective body-back gate voltage, and an initial effective body-front gate voltage;
    based on said partially depleted state-back surface potential and said partially depleted state-front surface potential, determining a critical surface potential for a transition from said partially depleted state to said fully depleted state;
    based on said critical surface potential, determining an estimated fully depleted state-back surface potential of said back surface at said transition; and,
    based on said estimated fully depleted state-back surface potential, determining an actual back surface potential and an actual front surface potential, said determining of said actual back surface potential and said actual front surface potential being performed using a coupled surface potential equation, and
    said adjusted effective body-back gate voltage and said adjusted effective body-front gate voltage being used during said iteratively repeating to determine said partially depleted state-back surface potential and said partially depleted state-front surface potential, respectively.

12. The method of claim 11, said decoupled surface potential equations being derived from Poisson's equation with boundary conditions set at zero and infinity and said coupled surface potential equation being derived from Poisson's equation with boundary conditions set at zero and a thickness of said semiconductor layer.

13. The method of claim 12,
said critical surface potential being determined as a function of channel length, channel doping and different bias voltages at said front gate and said back gate,
said determining of said estimated fully depleted state-back surface potential comprising using a Sigmoid function-based transition function, and
said coupled surface potential equation being solved using a Newton-Raphson method.

14. The method of claim 10, said bias-dependent body resistance being dependent upon a density of holes in said body region.

15. The method of claim 10, wherein modulation of said internal body node voltage modulates surface potentials of said back surface and said front surface at said channel region.

16. The method of claim 10, said multiple carrier injection sources comprising impact ionization current and gate-induced drain leakage current.

17. A computer program product comprising a computer readable storage medium having program instructions embodied therewith, said program instructions being executable by a computer to cause said computer to perform a method, said method comprising:
accessing, from a memory, a design, said design comprising physical size information and operating parameters for a dynamically depleted field effect transistor, said dynamically depleted field effect transistor comprising:
a semiconductor layer having a back surface and a front surface opposite said back surface, said semiconductor layer comprising a source region, a drain region, a body region and a channel region within said body region and positioned laterally between said source region and said drain region;
a back gate adjacent to said back surface at said channel region; and,
a front gate adjacent to said front surface at said channel region and opposite said back gate;
based on said design for said dynamically depleted field effect transistor, modeling performance of said dynamically depleted field effect transistor, said modeling comprising determining conditions of said operating parameters under which said channel region transitions from being in a partially depleted state to being in a fully depleted state by:
determining source-side actual front surface potential and source-side actual back surface potential and drain-side actual front surface potential and drain-side actual back surface potential, said determining of said source-side actual front surface potential and source-side actual back surface potential and said drain-side actual front surface potential and drain-side actual back surface potential comprising, for each side:
determining a partially depleted state-back surface potential of said back surface and a partially depleted state-front surface potential of said front surface, said determining of said partially depleted state-back surface potential and said partially depleted state-front surface potential being performed using decoupled surface potential equations, an initial effective body-back gate voltage, and an initial effective body-front gate voltage, said decoupled surface potential equations being derived from Poisson's equation with boundary conditions set at zero and infinity and said coupled surface potential equation being derived from Poisson's equation with boundary conditions set at zero and a thickness of said semiconductor layer,
based on said partially depleted state-back surface potential and said partially depleted state-front surface potential, determining a critical surface potential for a transition from said partially depleted state to said fully depleted state,
based on said critical surface potential, determining an estimated fully depleted state-back surface potential of said back surface at said transition, wherein determining said estimated fully depleted state-back surface potential comprises using a Sigmoid function-based transition function, and,
based on said estimated fully depleted state-back surface potential, determining an actual back surface potential and an actual front surface potential, said determining of said actual back surface potential and said actual front surface potential being performed using a coupled surface potential equation, said coupled surface potential equation being solved using a Newton-Raphson method,
determining a difference between said source-side actual front surface potential and said drain-side actual front surface potential,
determining a difference between said source-side actual back surface potential and said drain-side actual back surface potential,
determining a mid-point front surface potential between said source-side actual front surface potential and said drain-side actual front surface potential and a mid-point back surface potential between said source-side actual back surface potential and said drain-side actual back surface potential,
based on multiple carrier injection sources, determining a stored body charge in said body region at said mid-point front surface potential and said mid-point back surface potential,
based on said stored body charge, determining a bias-dependent body resistance in said body region,
based on said bias-dependent body resistance, determining an internal body node voltage in said body region,
based on said internal body node voltage, calculating an adjusted effective body-front gate voltage for said front gate and an adjusted effective body-back gate voltage for said back gate, and,
iteratively repeating said determining of said source-side actual front surface potential and source-side actual back surface potential and said drain-side actual front surface potential and drain-side actual back surface potential, said determining of said mid-point front surface potential and said mid-point back surface potential, said determining of said stored body charge, said determining of said bias-dependent body resistance, said determining of said internal body node voltage and said calculating said adjusted effective body-front gate voltage for said front gate and said adjusted effective body-back gate voltage for said back gate until an error in said mid-point back surface potential and said mid-point front surface potential is less than a predetermined error threshold,
said adjusted effective body-back gate voltage and said adjusted effective body-front gate voltage being used during said iteratively repeating to determine said partially depleted state-back surface potential and said partially depleted state-front surface potential, respectively, and said conditions comprising front gate bias voltage, back gate bias voltage, body resistance and body charge;

responsive to said determining said conditions under which said channel region transitions from being in a partially depleted state to being in a fully depleted state, incorporating said design for said dynamically depleted field effect transistor into a design for an integrated circuit, and storing said design for said integrated circuit in said memory; and causing said integrated circuit having said design for said dynamically depleted field effect transistor to be manufactured.

* * * * *